US011943925B2

(12) United States Patent
Kim et al.

(10) Patent No.: US 11,943,925 B2
(45) Date of Patent: Mar. 26, 2024

(54) SEMICONDUCTOR MEMORY DEVICE HAVING CHARGE STORAGE PATTERN

(71) Applicant: Samsung Electronics Co., Ltd., Suwon-si (KR)

(72) Inventors: Hyuncheol Kim, Seoul (KR); Jaeho Hong, Hwaseong-si (KR); Yongseok Kim, Suwon-si (KR); Ilgweon Kim, Hwaseong-si (KR); Hyeoungwon Seo, Yongin-si (KR); Sungwon Yoo, Suwon-si (KR); Kyunghwan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 290 days.

(21) Appl. No.: 17/335,763

(22) Filed: Jun. 1, 2021

(65) Prior Publication Data

US 2022/0130856 A1 Apr. 28, 2022

(30) Foreign Application Priority Data

Oct. 26, 2020 (KR) .................. 10-2020-0138902

(51) Int. Cl.
*G11C 8/14* (2006.01)
*G11C 7/18* (2006.01)
(Continued)

(52) U.S. Cl.
CPC ............ *H10B 43/27* (2023.02); *G11C 7/18* (2013.01); *G11C 8/14* (2013.01); *H01L 25/065* (2013.01); *H10B 43/10* (2023.02)

(58) Field of Classification Search
CPC .. G11C 7/18; G11C 8/14; H10B 43/10; H10B 69/00; H10B 53/00; H10B 53/10;
(Continued)

(56) References Cited

U.S. PATENT DOCUMENTS 6,294,805 B1 * 9/2001 Jung .................. H01L 28/55
257/295
8,472,249 B2 6/2013 Widjaja
(Continued)

FOREIGN PATENT DOCUMENTS

KR 101134353 B1 4/2012
KR 101480211 B1 1/2015
(Continued)

*Primary Examiner* — Didarul A Mazumder
*Assistant Examiner* — Gustavo G Ramallo
(74) *Attorney, Agent, or Firm* — Muir Patent Law, PLLC

(57) ABSTRACT

A semiconductor memory device includes first conductive lines stacked in a first direction perpendicular to a top surface of a substrate, second conductive lines extending in the first direction and intersecting the first conductive lines, and memory cells provided at intersection points between the first conductive lines and the second conductive lines, respectively. Each of the memory cells includes a semiconductor pattern parallel to the top surface of the substrate, the semiconductor pattern including a source region having a first conductivity type, a drain region having a second conductivity type, and a channel region between the source region and the drain region, first and second gate electrodes surrounding the channel region of the semiconductor pattern, and a charge storage pattern between the semiconductor pattern and the first and second gate electrodes.

20 Claims, 18 Drawing Sheets

(51) Int. Cl.
*H01L 25/065* (2023.01)
*H10B 43/10* (2023.01)
*H10B 43/27* (2023.01)

(58) Field of Classification Search
CPC ........ H10B 53/20; H10B 53/30; H10B 53/40;
H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/20;
H10B 43/23; H10B 43/27; H10B 43/30;
H10B 43/35; H10B 43/40; H10B 43/50;
H10B 51/00; H10B 51/10; H10B 51/20;
H10B 51/30; H10B 51/40; H10B 51/50
See application file for complete search history.

(56) References Cited

U.S. PATENT DOCUMENTS

| | | | |
|---|---|---|---|
| 9,715,933 B2 | 7/2017 | Hsu | |
| 9,837,155 B1 | 12/2017 | Kim et al. | |
| 9,859,004 B1 | 1/2018 | Alsmeier | |
| 10,008,265 B2 | 6/2018 | Hsu | |
| 10,546,869 B2 | 1/2020 | Cho et al. | |
| 10,784,272 B2 | 9/2020 | Lee et al. | |
| 2001/0008786 A1* | 7/2001 | Tsukiji | H10B 69/00 438/257 |
| 2003/0075755 A1* | 4/2003 | Yamazaki | H01L 29/40114 257/E29.302 |
| 2010/0109065 A1* | 5/2010 | Oh | H01L 27/0688 257/314 |
| 2011/0215371 A1 | 9/2011 | Tang | |
| 2012/0025287 A1* | 2/2012 | Golubovic | H01L 29/42348 257/E27.084 |
| 2013/0161713 A1* | 6/2013 | Yamazaki | H10B 12/036 257/296 |
| 2019/0103407 A1* | 4/2019 | Kim | H01L 28/86 |
| 2019/0164985 A1* | 5/2019 | Lee | H10B 12/05 |
| 2020/0234736 A1* | 7/2020 | Sim | G11C 13/0004 |
| 2020/0273912 A1 | 8/2020 | Park et al. | |

FOREIGN PATENT DOCUMENTS

| | | |
|---|---|---|
| KR | 101859847 B1 | 5/2018 |
| TW | I597821 B | 9/2017 |
| WO | 2020152523 A1 | 7/2020 |

* cited by examiner

SEMICONDUCTOR MEMORY DEVICE HAVING CHARGE STORAGE PATTERN

CROSS-REFERENCE TO RELATED APPLICATION

This U.S. non-provisional patent application claims priority under 35 U.S.C. § 119 to Korean Patent Application No. 10-2020-0138902, filed on Oct. 26, 2020, in the Korean Intellectual Property Office, the disclosure of which is hereby incorporated by reference in its entirety.

BACKGROUND

Embodiments of the inventive concepts relate to a semiconductor memory device and, more particularly, to a semiconductor memory device capable of operating in volatile and non-volatile memory modes.

Semiconductor memory devices may include a non-volatile memory device (e.g., a flash memory device) and a volatile memory device (e.g., a dynamic random access memory (DRAM) device).

The non-volatile memory device may retain data stored in a memory cell even when its power supply is interrupted, but an operation of writing or erasing data into or from the memory cell may be performed for a long time. The number of times to write or erase data in the non-volatile memory device may be limited.

The volatile memory device may lose data stored in a memory cell when its power supply is interrupted. However, an operation of rewriting data in the volatile memory device may be performed for a short time, and the number of times to rewrite data in the volatile memory device may be greater compared to the non-volatile memory device.

Thus, semiconductor memory devices having both non-volatile and volatile memory characteristics have been studied.

SUMMARY

Embodiments of the inventive concepts may provide a semiconductor memory device capable of operating in volatile and non-volatile memory modes and of improving an integration density.

According to an embodiment of the present inventive concept, a semiconductor memory device includes a plurality of first conductive lines stacked in a first direction perpendicular to a top surface of a substrate and extending lengthwise in a second direction parallel to the top surface of the substrate, a plurality of second conductive lines extending lengthwise in the first direction and spaced apart from the plurality of first conductive lines in a third direction parallel to the top surface of the substrate and different from the second direction, and a plurality of memory cells, each being provided at a corresponding one of a plurality of intersection points between the plurality of first conductive lines and the plurality of second conductive lines. Each memory cell includes a semiconductor pattern extending parallel to the top surface of the substrate, the semiconductor pattern including a source region having a first conductivity type, a drain region having a second conductivity type different from the first conductivity type, and a channel region between the source region and the drain region, first and second gate electrodes surrounding the channel region of the semiconductor pattern, and a charge storage pattern between the semiconductor pattern.

According to an embodiment of the present inventive concept, a semiconductor memory device includes a plurality of semiconductor patterns stacked in a first direction perpendicular to a top surface of a substrate, each semiconductor patterns including a source region having a first conductivity type, a drain region having a second conductivity type different from the first conductivity type, and a channel region between the source region and the drain region, a pair of first and second word lines surrounding a channel region of each of the plurality of semiconductor patterns and extending lengthwise in the first direction, a plurality of charge storage patterns, each surrounding a channel region of a corresponding semiconductor pattern of the plurality of semiconductor patterns, and being disposed between the corresponding semiconductor pattern and each of the pair of the first and second word lines, a plurality of first conductive lines stacked in the first direction, each being connected to a drain region of a corresponding one of the plurality of semiconductor patterns, and a second conductive line extending lengthwise in the first direction and connected in common to a plurality of source regions of the plurality of semiconductor patterns.

According to an embodiment of the present inventive concept, a semiconductor memory device includes a plurality of first bit lines extending lengthwise in a first direction parallel to a top surface of a substrate and stacked in a second direction perpendicular to the top surface of the substrate, a plurality of second bit lines extending lengthwise in the first direction and stacked in the second direction, the plurality of second bit lines spaced apart from the plurality of first bit lines in a third direction parallel to the top surface of the substrate and intersecting the first and second directions, a plurality of source lines extending lengthwise in the second direction between the plurality of first bit lines and the plurality of second bit lines and spaced apart from each other in the first direction, a plurality of first memory cells, each being provided at a corresponding one of a plurality of intersection points of the plurality of first bit lines and the plurality of source lines, each first memory cell including a first semiconductor pattern including a first source region having a first conductivity type, a first drain region having a second conductivity type different from the first conductivity type, and a first channel region between the first source region and the first drain region, a plurality of second memory cells, each being provided at a corresponding one of a plurality of intersection points of the plurality of second bit lines and the plurality of source lines, each second memory cell including a second semiconductor pattern including a second source region having the first conductivity type, a second drain region having the second conductivity type, and a second channel region between the second source region and the second drain region, a pair of first and second word lines surrounding each of a plurality of first channel regions of a plurality of first semiconductor patterns of the plurality of first memory cells and extending in the first direction and the second direction, a plurality of first charge storage patterns, each surrounding a first channel region of a corresponding first semiconductor pattern of the plurality of first semiconductor patterns, and being disposed between the corresponding first semiconductor pattern and each of the pair of the first and second word lines, a pair of third and fourth word lines surrounding each of a plurality of second channel regions of a plurality of second semiconductor patterns of the plurality of second memory cells and extending in the first direction and the second direction, and a plurality of second charge storage patterns, each surrounding a second channel region of a corresponding second semiconductor pattern of the plurality of second semiconductor patterns, and being disposed between the corresponding second semiconductor pattern and each of the pair of the third and fourth word lines.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, semiconductor memory devices according to some embodiments of the inventive concepts will be described in detail with reference to the accompanying drawings.

Figure 1:
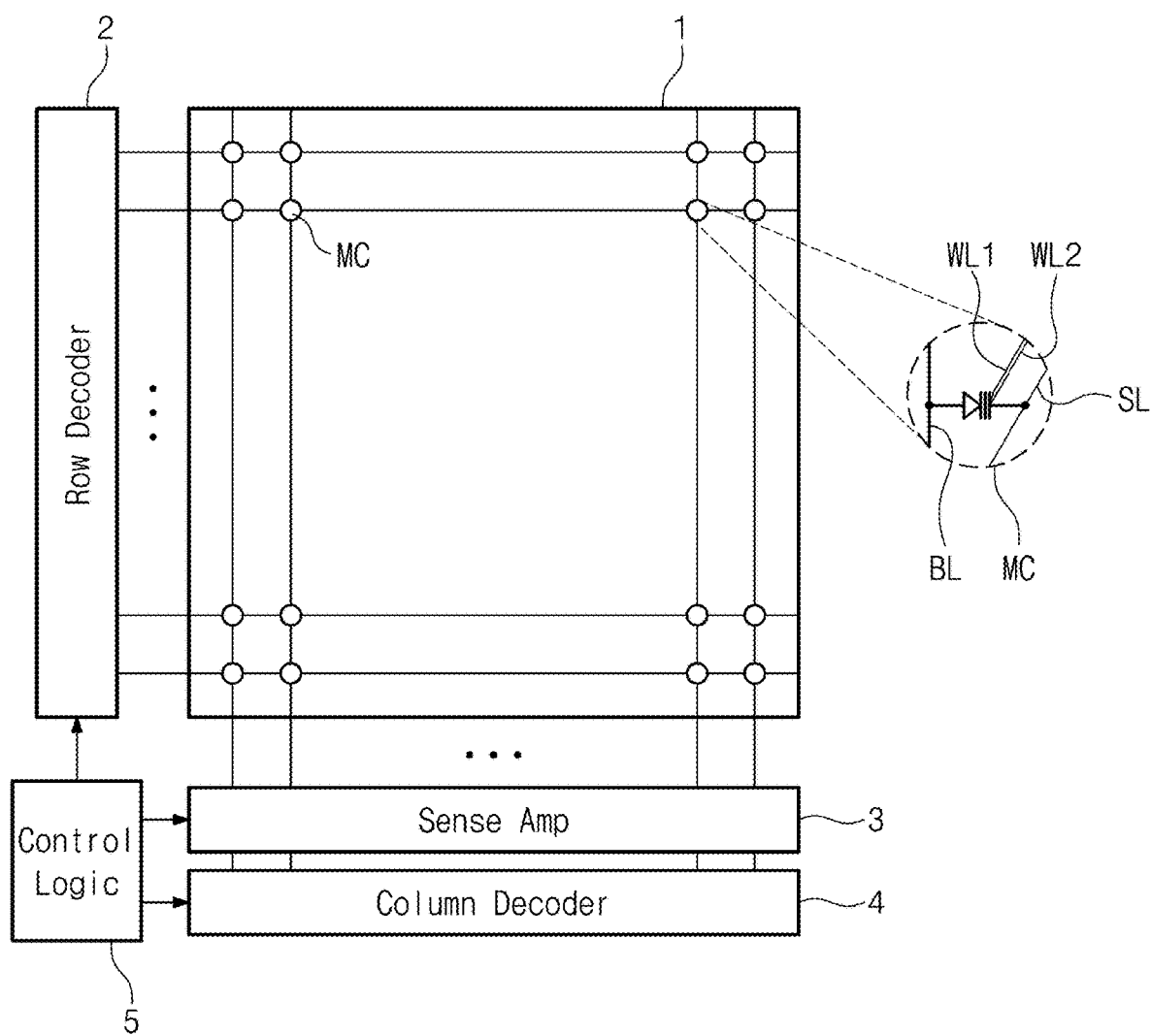
FIG. 1 is a block diagram illustrating a semiconductor memory device according to some embodiments of the inventive concepts.

FIG. 1 is a block diagram illustrating a semiconductor memory device according to some embodiments of the inventive concepts.

Referring to FIG. 1, a semiconductor memory device may include a memory cell array 1, a row decoder 2, a sense amplifier 3, a column decoder 4, and a control logic 5.

The memory cell array 1 may include a plurality of memory cells MC three-dimensionally arranged. The memory cell array 1 may include first conductive lines BL, second conductive lines SL intersecting the first conductive lines BL, and the plurality of memory cells MC disposed at intersection points of the first and second conductive lines BL and SL, respectively.

In some embodiments, each of the memory cells MC may operate in a volatile memory mode or a non-volatile memory mode, depending on a voltage condition. Each of the memory cells MC may include first and second gate electrodes, a source electrode, and a drain electrode. The drain electrode of each of the memory cells MC may be connected to the first conductive line (e.g., a bit line BL), and the source electrode of each of the memory cells MC may be connected to the second conductive line (e.g., a source line SL). The first gate electrode of each of the memory cells MC may be connected to a first word line WL1, and the second gate electrode of each of the memory cells MC may be connected to a second word line WL2.

The row decoder 2 may decode an address signal inputted from the outside to select one among the source lines SL of the memory cell array 1. The address signal decoded in the row decoder 2 may be provided to a row driver (not shown), and the row driver may provide predetermined voltages to the source lines SL, respectively, in response to control signals of control circuits.

The sense amplifier 3 may sense and amplify a voltage difference between a reference bit line and the bit line BL selected by an address signal decoded from the column decoder 4 and may output the amplified voltage difference to an external device (e.g., a memory controller).

The column decoder 4 may provide a data transmission path between the sense amplifier 3 and an external device (e.g., a memory controller). The column decoder 4 may decode an address signal inputted from the outside to select one among the bit lines BL.

The control logic 5 may generate control signals for controlling operations of writing/reading data into/from the memory cell array 1.

Figure 2:
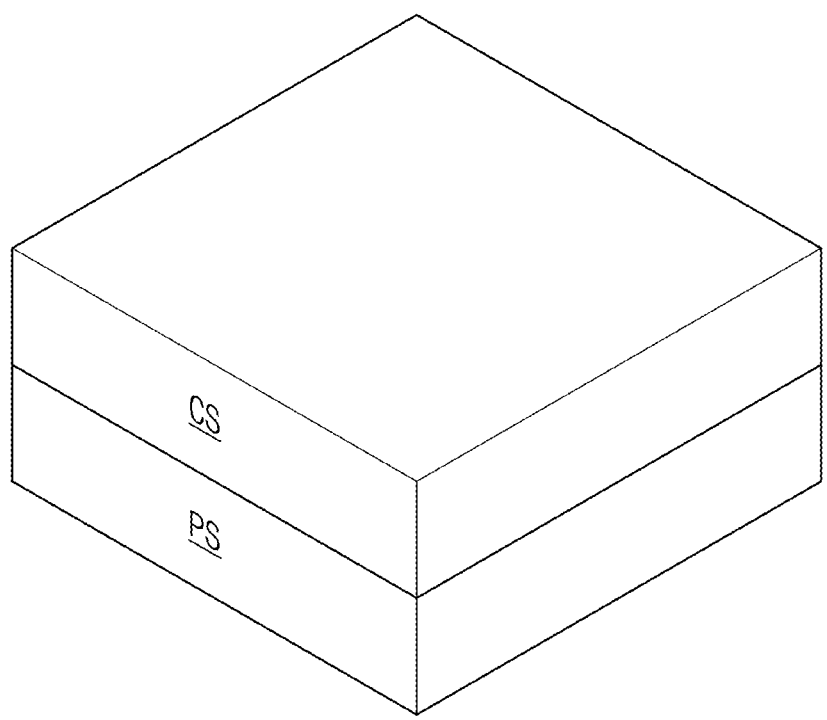
FIG. 2 is a perspective view schematically illustrating a semiconductor memory device according to some embodiments of the inventive concepts.

FIG. 2 is a perspective view schematically illustrating a semiconductor memory device according to some embodiments of the inventive concepts.

Referring to FIG. 2, a semiconductor memory device may include a cell array structure CS and a peripheral circuit structure PS on the cell array structure CS.

The peripheral circuit structure PS may include core and peripheral circuits formed on a semiconductor substrate. The core and peripheral circuits may include the row and column decoders 2 and 4 (see FIG. 1), the sense amplifier 3 (see FIG. 1) and the control logic 5 (see FIG. 1), described with reference to FIG. 1.

The cell array structure CS may be disposed on the peripheral circuit structure PS and may include a memory cell array including memory cells three-dimensionally arranged on the peripheral circuit structure PS. The memory cell array may include horizontal patterns sequentially stacked on a substrate, vertical patterns vertically intersecting the horizontal patterns, and memory elements disposed between the horizontal patterns and the vertical patterns.

In some embodiments, the peripheral circuit structure PS may be formed on a first semiconductor substrate, and the cell array structure CS may be formed on a second semiconductor substrate. Metal pads of the first semiconductor substrate may be connected to metal pads of the second semiconductor substrate by a bonding method, and thus the peripheral circuit structure PS may be electrically connected to the cell array structure CS.

Figure 3:
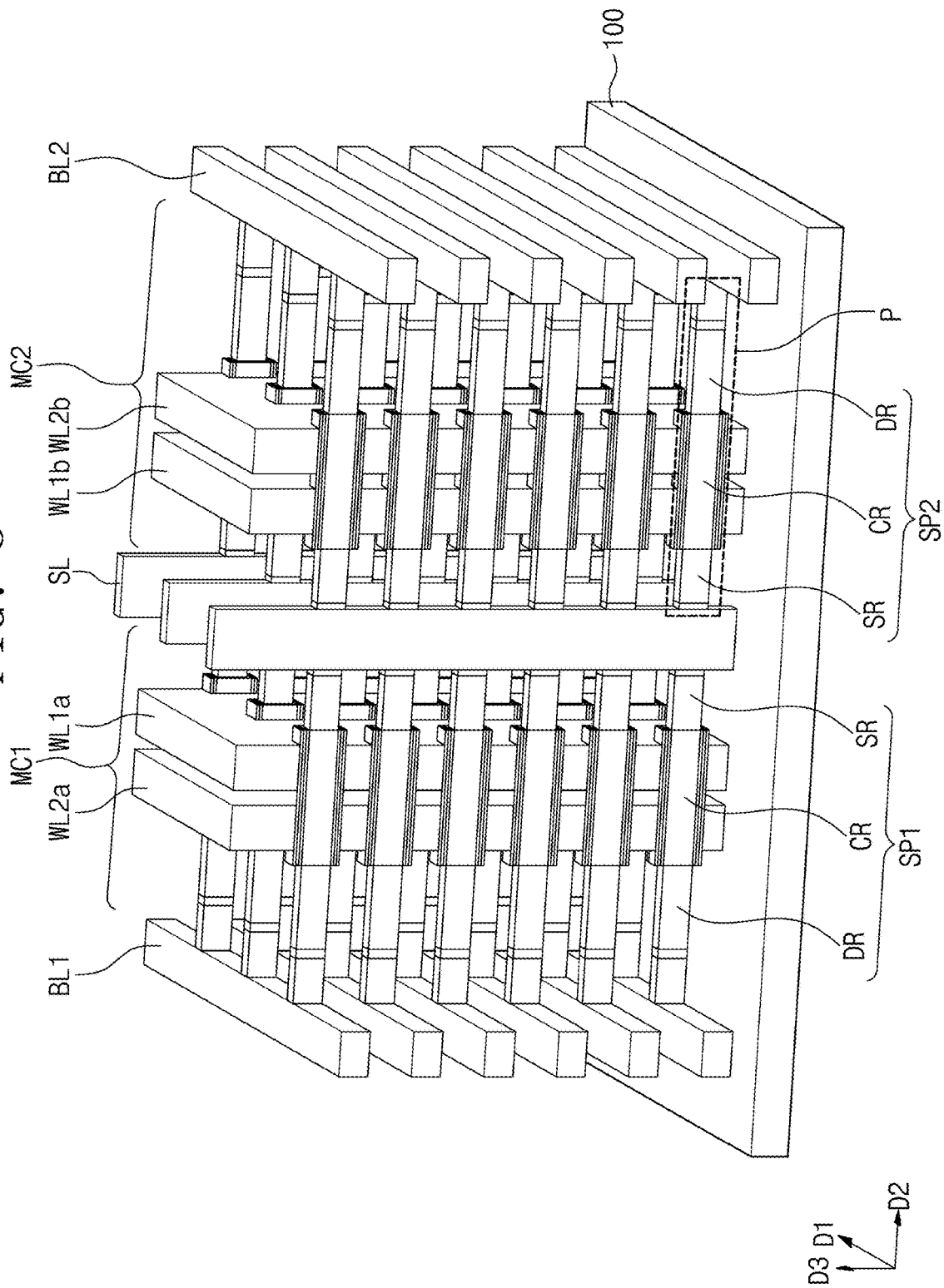
FIG. 3 is a perspective view illustrating a memory cell array of a semiconductor memory device according to some embodiments of the inventive concepts.
Figure 4:
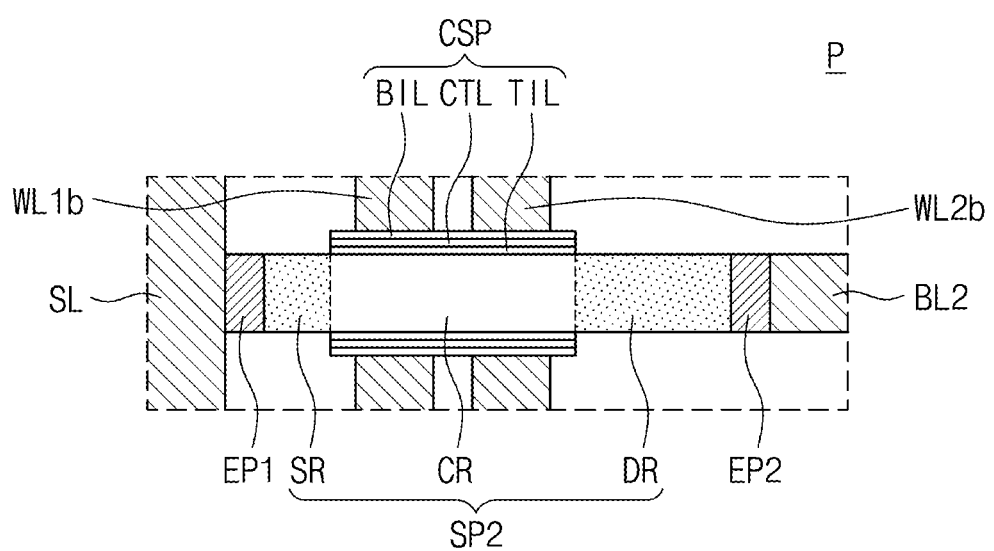
FIG. 4 is an enlarged cross-sectional view of a portion 'P' of FIG. 3 to illustrate a unit memory cell of a semiconductor memory device according to some embodiments of the inventive concepts.

FIG. 3 is a perspective view illustrating a memory cell array of a semiconductor memory device according to some embodiments of the inventive concepts. FIG. 4 is an enlarged cross-sectional view of a portion 'P' of FIG. 3 to illustrate a unit memory cell of a semiconductor memory device according to some embodiments of the inventive concepts.

Referring to FIG. 3, first conductive lines and second conductive lines, which intersect each other, may be provided on a substrate 100. In the following embodiments, the first conductive lines will be described as bit lines BL, and the second conductive lines will be described as source lines SL. In certain embodiments, the first conductive lines may be source lines, and the second conductive lines may be bit lines.

The substrate 100 may be a semiconductor substrate including a semiconductor material. For example, the semiconductor substrate may be a silicon substrate, a germanium substrate, or a silicon-germanium substrate.

Bit lines BL1 and BL2 may extend lengthwise in a first direction D1 parallel to a top surface of the substrate 100 and may be stacked in a third direction D3 perpendicular to the top surface of the substrate 100. In some embodiments, the bit lines BL1 and BL2 may include first bit lines BL1 provided at one side of the source lines SL, and second bit lines BL2 provided at another side of the source lines SL. For example, the second bit lines BL2 may be spaced apart from the first bit lines BL1 in a second direction D2 with the source lines SL interposed therebetween. The second direction D2 parallel to a top surface of the substrate 100 may be different from the first direction D1.

The source lines SL may be disposed between the first and second bit lines BL1 and BL2 and may extend lengthwise in the third direction D3 perpendicular to the top surface of the substrate 100. The source lines SL may be spaced apart from each other in the first direction D1 on the substrate 100.

For example, the first and second bit lines BL1 and BL2 and the source lines SL may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide).

Memory cells MC1 and MC2 may be provided at intersection points of the source lines SL and the first and second bit lines BL1 and BL2, respectively. For example, the memory cells MC1 and MC2 may be three-dimensionally arranged on the substrate 100. In some embodiments, the memory cells MC1 and MC2 may include first memory cells MC1 provided at intersection points of the first bit lines BL1 and the source lines SL, respectively, and second memory cells MC2 provided at intersection points of the second bit lines BL2 and the source lines SL, respectively. The first and second memory cells MC1 and MC2 adjacent to each other in the second direction D2 may share the source line SL. One of the first and second memory cells MC1 and MC2 may be selected by one selected among the first and second bit lines BL1 and BL2 and one selected among the source lines SL.

Each of the first and second memory cells MC1 and MC2 may include a semiconductor pattern SP1 or SP2. The semiconductor pattern SP1 or SP2 may have a bar shape having a long axis in the second direction D2. Each of the first memory cells MC1 may include a first semiconductor pattern SP1, and each of the second memory cells MC2 may include a second semiconductor pattern SP2.

The first and second semiconductor patterns SP1 and SP2 of the first and second memory cells MC1 and MC2 may be spaced apart from each other in the first direction D1, the second direction D2 and the third direction D3. For example, the first and second semiconductor patterns SP1 and SP2 may be three-dimensionally arranged on the substrate 100. The first and second semiconductor patterns SP1 and SP2 may include at least one of silicon or germanium. Alternatively, the first and second semiconductor patterns SP1 and SP2 may include an oxide semi conductor material.

Referring to FIG. 4, each of the first and second semiconductor patterns SP1 and SP2 may include a source region SR having a first conductivity type (e.g., an N-type), a drain region DR having a second conductivity type (e.g., a P-type), and a channel region CR in an intrinsic state between the source region SR and the drain region DR. The source region SR may be doped with N-type dopants, and the drain region DR may be doped with P-type dopants. A length of the source region SR in the second direction D2 may be different from a length of the drain region DR in the second direction D2.

The drain region DR of the first semiconductor pattern SP1 may be electrically connected to the first bit line BL1, and the drain region DR of the second semiconductor pattern SP2 may be electrically connected to the second bit line BL2. The source regions SR of the first and second semiconductor patterns SP1 and SP2 adjacent to each other in the second direction D2 may be electrically connected to one of the source lines SL. The first and second semiconductor patterns SP1 and SP2 may be mirror-symmetrical with respect to the source line SL. For example, the arrangement of the source region SR, the channel region CR, and the drain region DR of the first semiconductor pattern SP1 may be mirror-symmetrical to the arrangement of the source region SR, the channel region CR, and the drain region DR of the second semiconductor pattern SP2 with respect to the source line SL.

Referring again to FIG. 3, each of the first bit lines BL1 may be connected to a corresponding one of the drain regions DR of the first semiconductor patterns SP1 arranged in the first direction D1. Each of the second bit lines BL2 may be connected to a corresponding one of the drain regions DR of the second semiconductor patterns SP2 arranged in the first direction D1. Each of the source lines SL may be connected to a corresponding one of the source regions SR of the first and second semiconductor patterns SP1 and SP2 arranged in the third direction D3.

First and second word lines WL1a and WL2a may extend in the first direction D1 and the third direction D3 between the first bit lines BL1 and the source lines SL. The first and second word lines WL1a and WL2a may be spaced apart from each other in the second direction D2. The first and second word lines WL and WL2a may surround each of the first semiconductor patterns SP1. The first and second word lines WL1a and WL2a may be adjacent to the channel regions CH of the first semiconductor patterns SP1.

Third and fourth word lines WL1b and WL2b may extend in the first direction D1 and the third direction D3 between the second bit lines BL2 and the source lines SL. The third and fourth word lines WL1b and WL2b may be spaced apart from each other in the second direction D2. The third and fourth word lines WL1b and WL2b may surround each of the second semiconductor patterns SP2. The third and fourth word lines WL1b and WL2b may be adjacent to the channel regions CH of the second semiconductor patterns SP2.

For example, the first, second, third and fourth word lines WL1a, WL2a, WL1b and WL2b may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide).

Charge storage patterns CSP may be disposed between the first semiconductor patterns SP1 and the first and second word lines WL1a and WL2a and between the second semiconductor patterns SP2 and the third and fourth word lines WL1b and WL2b. For example, each charge storage pattern CSP may be disposed between a corresponding first semiconductor pattern of the first semiconductor patterns SP1 and the first and second word lines WL1a and WL2a, and between a corresponding second semiconductor pattern of the second semiconductor patterns SP2 and the first and second word lines WL1a and WL2a. The charge storage patterns CSP may surround sidewalls of the first and second semiconductor patterns SP1 and SP2, respectively. Each of the charge storage patterns CSP may have a pipe or macaroni shape having opposite open ends. Each of the charge storage patterns CSP may be formed of a single thin layer or a plurality of thin layers.

In some embodiments, each of the charge storage patterns CSP may include a tunnel insulating layer TIL, a charge trap layer CTL and a blocking insulating layer BIL, which are sequentially stacked on a surface of each of the first and second semiconductor patterns SP1 and SP2.

The charge trap layer CTL may include at least one of a silicon nitride layer, a silicon oxynitride layer, a silicon-rich nitride layer, a nano-crystalline silicon layer, or a laminated trap layer. The tunnel insulating layer TIL may include at least one of materials of which energy band gaps are greater than that of the charge trap layer CTL. For example, the tunnel insulating layer TIL may be a silicon oxide layer. The blocking insulating layer BIL may include at least one of materials of which energy band gaps are less than that of the tunnel insulating layer TIL and greater than that of the charge trap layer CTL. For example, the blocking insulating layer BIL may include at least one of high-k dielectric layers such as an aluminum oxide layer and a hafnium oxide layer.

As illustrated in FIGS. 3 and 4, a first electrode EP1 may be disposed between the source line SL and each of the first and second semiconductor patterns SP1 and SP2, and a second electrode EP2 may be disposed between the first semiconductor pattern SP1 and the first bit line BL1, and between the second semiconductor pattern SP2 and the second bit line BL2. For example, the first and second electrodes EP1 and EP2 may include or may be formed of at least one of W, Ti, Al, Cu, C, CN, TiN, TiAlN, TiSiN, TiCN, WN, CoSiN, WSiN, TaN, TaCN, or TaSiN.

Figure 5:
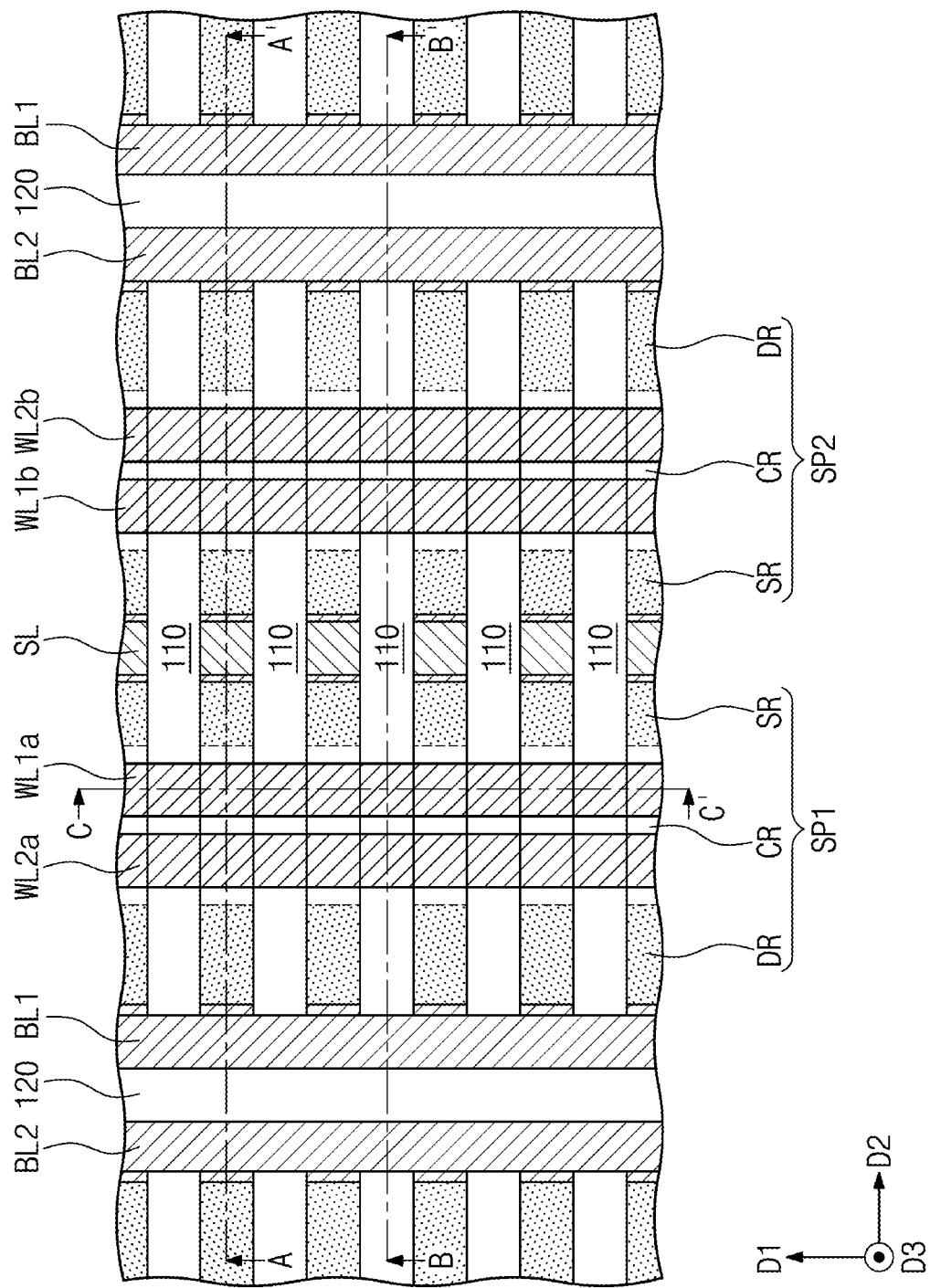
FIG. 5 is a plan view illustrating a semiconductor memory device according to some embodiments of the inventive concepts.
Figure 6:
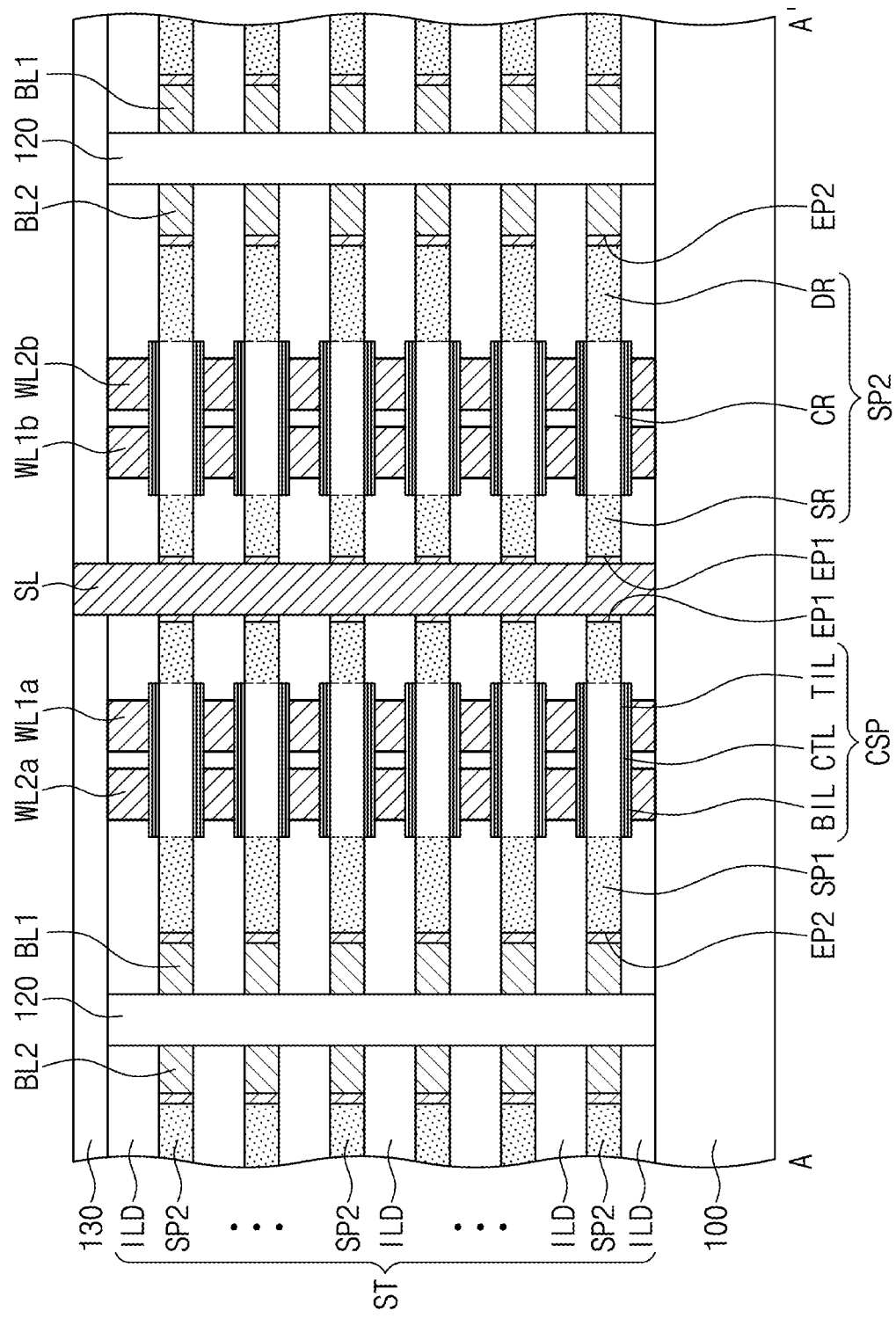
FIG. 6 is a cross-sectional view taken along line A-A' of FIG. 5 to illustrate a semiconductor memory device according to some embodiments of the inventive concepts.
Figure 7:
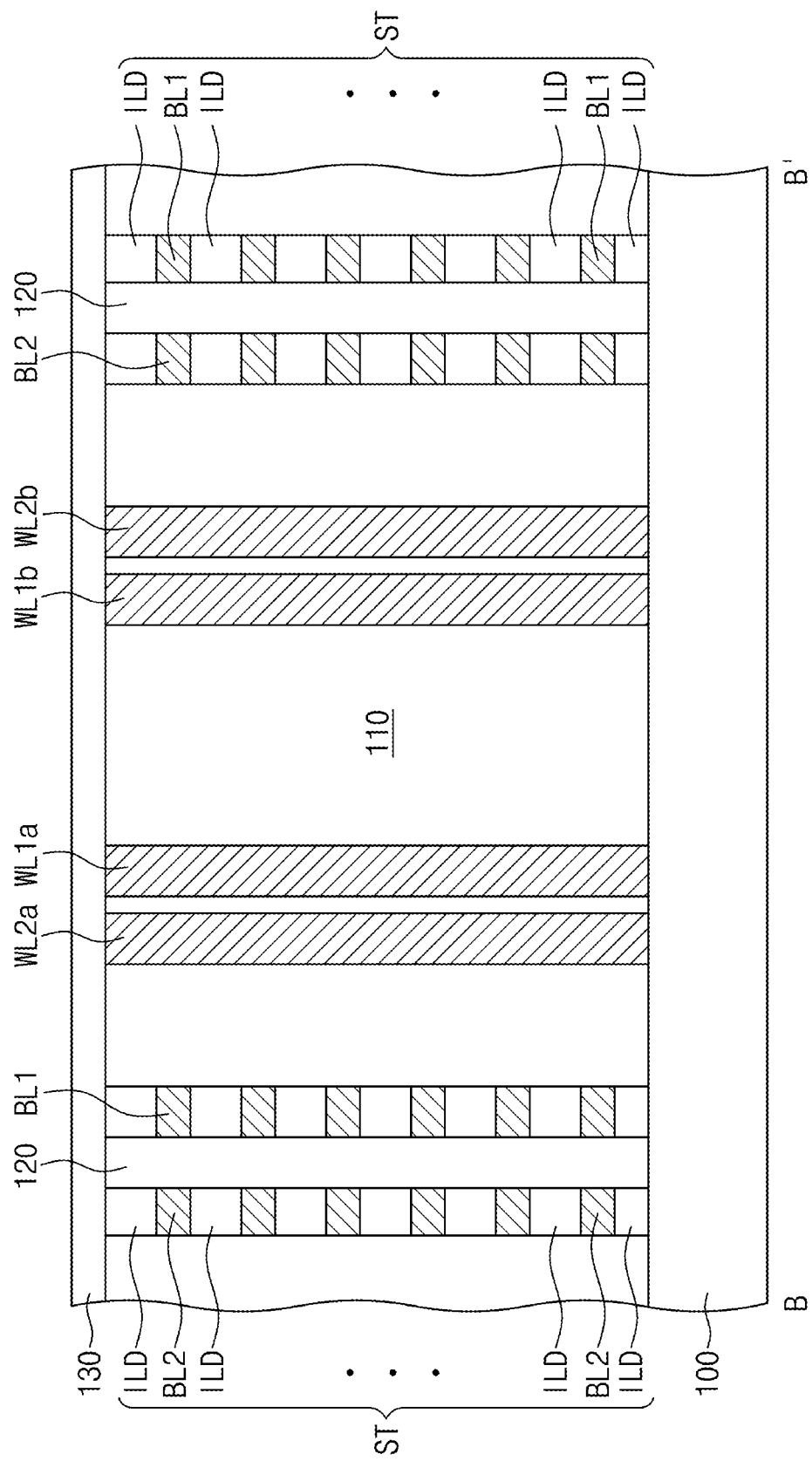
FIG. 7 is a cross-sectional view taken along line B-B' of FIG. 5 to illustrate a semiconductor memory device according to some embodiments of the inventive concepts.
Figure 8:
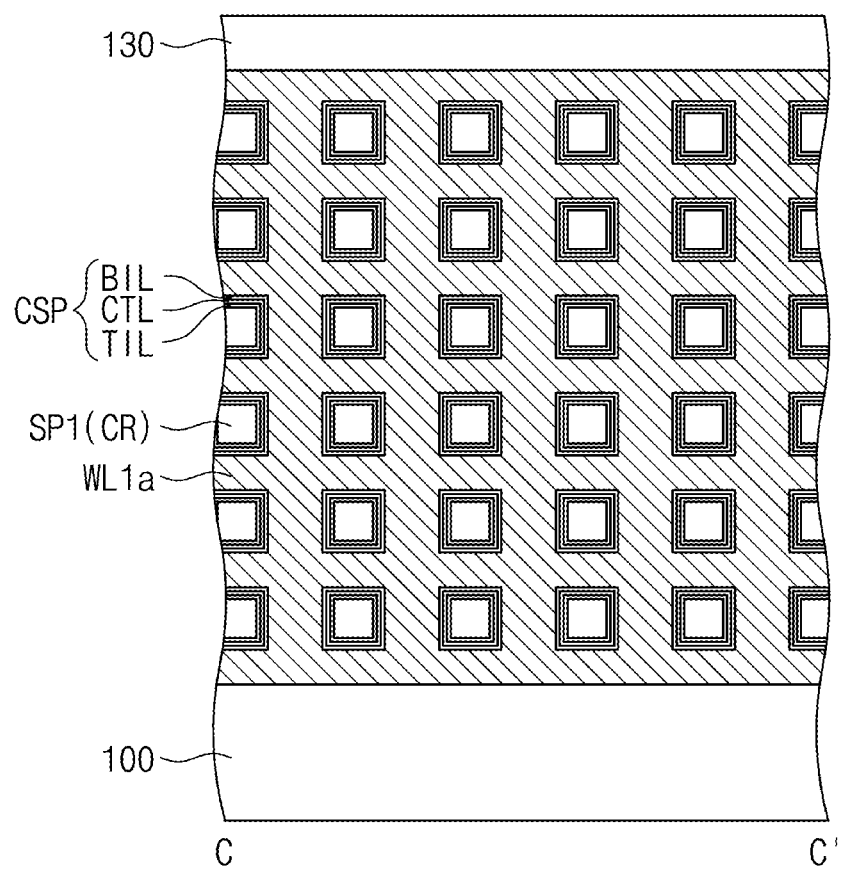
FIG. 8 is a cross-sectional view taken along line C-C' of FIG. 5 to illustrate a semiconductor memory device according to some embodiments of the inventive concepts.

FIG. 5 is a plan view illustrating a semiconductor memory device according to some embodiments of the inventive concepts. FIG. 6 is a cross-sectional view taken along line A-A' of FIG. 5 to illustrate a semiconductor memory device according to some embodiments of the inventive concepts. FIG. 7 is a cross-sectional view taken along line B-B' of FIG. 5 to illustrate a semiconductor memory device according to some embodiments of the inventive concepts. FIG. 8 is a cross-sectional view taken along line C-C' of FIG. 5 to illustrate a semiconductor memory device according to some embodiments of the inventive concepts.

Referring to FIGS. 5, 6, 7 and 8, stack structures ST may be disposed on a substrate 100. The stack structures ST may be spaced apart from each other in the first direction D1 and the second direction D2 on the substrate 100. For example, the stack structures ST may be separated from each other in the second direction D2 by second separation insulating patterns 120, and may be separated from each other in the first direction D1 by first separation insulating patterns 110.

For example, the substrate 100 may be a single-crystalline silicon substrate or a silicon-on-insulator (SOI) substrate. In some embodiments, the substrate 100 may further include a thin layer formed on a semiconductor substrate. However, embodiments of the inventive concepts are not limited thereto.

Each of the stack structures ST may include interlayer insulating layers ILD and first or second semiconductor patterns SP1 or SP2, which are alternately stacked in the third direction D3 perpendicular to the top surface of the substrate 100. Each of the stack structures ST may include the interlayer insulating layers ILD and first conductive lines, which are alternately stacked in the third direction D3. In some embodiments, the first conductive lines may include first bit lines BL1 and second bit lines BL2.

The stack structures ST may include the first semiconductor patterns SP1 provided at intersection points of the first bit lines BL1 and source lines SL, respectively, and the second semiconductor patterns SP2 provided at intersection points of the second bit lines BL2 and the source lines SL, respectively. For example, in the stack structures ST, each first semiconductor pattern SP1 may be provided at a corresponding one of the intersection points of the first bit lines BL1 and the source lines SL, and each second semiconductor pattern SP2 may be provided at a corresponding one of the intersection points of the second bit lines BL2 and the source lines SL.

The first semiconductor patterns SP1 between the first bit lines BL1 and the source lines SL may be spaced apart from each other in the first direction D1 and the third direction D3. For the simplicity of drawings, FIG. 5 shows five stack structures disposed between the first bit lines BL1 and the source lines SL, and FIGS. 6 and 7 show thirteen levels between the substrate 100 and an upper insulating layer 130. FIG. 6 shows a single stack structure between the second separation insulating pattern 120 and the source line SL. The first semiconductor patterns SP1 of each stack structure may be connected in common to a corresponding one of the source lines SL, and the first semiconductor patterns SP1 at each level may be connected in common to a corresponding one of the first bit lines BL1. The first semiconductor patterns SP1 located at the same level may be separated from each other in the first direction D1 by the first separation insulating patterns 110 disposed therebetween. The first semiconductor patterns SP1 spaced apart from each other in the third direction D3 may be connected to the first bit lines BL1, respectively, and may be connected in common to a corresponding one of the source lines SL. The first semiconductor patterns SP1 spaced apart from each other in the third direction D3 may be separated from each other by the interlayer insulating layers ILD disposed therebetween.

The second semiconductor patterns SP2 between the second bit lines BL2 and the source lines SL may be spaced apart from each other in the first direction D1 and the third direction D3. The second semiconductor patterns SP2 of each stack structure may be connected in common to a corresponding one of the source lines SL, and the second semiconductor patterns SP2 at each level may be connected in common to a corresponding one of the second bit lines BL2. The second semiconductor patterns SP2 located at the same level may be separated from each other by the first separation insulating patterns 110 disposed therebetween. The second semiconductor patterns SP2 spaced apart from each other in the third direction D3 may be connected to the second bit lines BL2, respectively, and may be connected in common to a corresponding one of the source lines SL. The second semiconductor patterns SP2 spaced apart from each other in the third direction D3 may be separated from each other by the interlayer insulating layers ILD disposed therebetween. The second semiconductor patterns SP2 may be spaced apart from the first semiconductor patterns SP1 in the second direction D2.

Each of the first and second semiconductor patterns SP1 and SP2 may include or may be formed of a poly-crystalline silicon layer or a single-crystalline silicon layer. Each of the interlayer insulating layers ILD may include or may be formed of at least one of a silicon oxide layer, a silicon oxynitride layer, or a silicon nitride layer. In each of the stack structures ST, each of the first and second semiconductor patterns SP1 and SP2 may have a bar shape having a long axis in the second direction D2, as described above. Each of the first and second semiconductor patterns SP1 and SP2 may include a source region SR, a drain region DR, and a channel region CR between the source region SR and the drain region DR. The source and drain regions SR and DR may have conductivity types opposite to (i.e., different from) each other. Each of the first and second semiconductor patterns SP1 and SP2 may be locally provided between a pair of the first separation insulating patterns 110 adjacent to each other in the first direction D1 and between a pair of the interlayer insulating layers ILD adjacent to each other in the third direction D3.

The first and second semiconductor patterns SP1 and SP2 may be symmetrical with respect to the source line SL disposed therebetween. For example, the source regions SR of the first and second semiconductor patterns SP1 and SP2 adjacent to each other in the second direction D2 may be connected in common to a corresponding source line SL. The drain regions DR of the first and second semiconductor patterns SP1 and SP2 adjacent to each other in the second direction D2 may be connected to the first and second bit lines BL1 and BL2, respectively.

A first electrode EP1 may be disposed between each of the source lines SL and each of the source regions SR of the first and second semiconductor patterns SP1 and SP2, and a second electrode EP2 may be disposed between each of the first and second bit lines BL1 and BL2 and each of the drain regions DR of the first and second semiconductor patterns SP1 and SP2.

The first and second bit lines BL1 and BL2 may extend in the first direction D1. The first and second bit lines BL1 and BL2 may be spaced apart from each other in the second direction D2 on each of the interlayer insulating layers ILD and may be disposed between the interlayer insulating layers ILD adjacent to each other in the third direction D3. The lowermost one of the interlayer insulating layers ILD may be disposed between the substrate 100 and the lowermost ones of the first and second bit lines BL1 and BL2. However, embodiments of the inventive concepts are not limited thereto.

The first bit lines BL1 (or the second bit lines BL2) may be spaced apart from each other in the third direction D3 by the interlayer insulating layers ILD of each of the stack structures ST.

Each of the stack structures ST may include a second conductive line (i.e., the source line SL) disposed between the first bit lines BL1 and the second bit lines BL2. The source line SL may extend from the top surface of the substrate 100 in the third direction D3. The source lines SL between the first and second bit lines BL1 and BL2 may be spaced apart from each other in the first direction D1. The source lines SL may extend lengthwise in the third direction D3 different from the first direction D1 in which the first and second bit lines BL1 and BL2 extend. Lengths of the source lines SL in the third direction D3 may be substantially equal to each other. Each of the source lines SL may penetrate the interlayer insulating layers ILD. The source lines SL may be disposed between the first semiconductor patterns SP1 and the second semiconductor patterns SP2.

The first and second bit lines BL1 and BL2 and the source lines SL may include or may be formed of a conductive material such as metal (e.g., copper, tungsten, or aluminum) and/or a metal nitride (e.g., tantalum nitride, titanium nitride, or tungsten nitride). The interlayer insulating layers ILD may include or may be formed of, for example, silicon nitride.

Each of the first separation insulating patterns 110 may be disposed between the stack structures ST adjacent to each other in the first direction D1. The first separation insulating patterns 110 may extend from the top surface of the substrate 100 in the third direction D3 and may be spaced apart from each other in the first direction D1. Each of the first separation insulating patterns 110 may extend in the second direction D2 so as to be in contact with sidewalls of the first and second semiconductor patterns SP1 and SP2. Each of the first separation insulating patterns 110 may be in contact with sidewalls of the source lines SL adjacent to each other in the first direction D1. Each of the source lines SL may be disposed between the first separation insulating patterns 110 adjacent to each other in the first direction D1. The first separation insulating patterns 110 may include or may be formed of, for example, an oxide, a nitride, and/or an oxynitride.

The second separation insulating patterns 120 may be provided at opposite sides of the stack structures ST on the substrate 100. The second separation insulating patterns 120 may cover opposite sidewalls of the stack structure ST. When the stack structures ST are viewed in a plan view as shown in FIG. 5 (hereinafter referred to as "in the plan view"), the second separation insulating patterns 120 may extend in the first direction D1. The second separation insulating patterns 120 may be spaced apart from each other in the second direction D2 which is parallel to the top surface of the substrate 100 and intersects the first direction D1. The second separation insulating patterns 120 may be spaced apart from each other in the second direction D2 with the stack structure ST interposed therebetween. The second separation insulating patterns 120 may include or may be formed of, for example, oxide, nitride, and/or oxynitride.

First and second word lines WL and WL2a, and third and fourth word lines WL1b and WL2b may extend in the first direction D1 to intersect the stack structures ST arranged in the first direction D1. The first and second word lines WL1a and WL2a may be provided between the first bit lines BL1 and the source lines SL. The third and fourth word lines WL1b and WL2b may be provided between the second bit lines BL2 and the source lines SL.

The first and second word lines WL and WL2a, and the third and fourth word lines WL1b and WL2b may have substantially the same thickness in the third direction D3.

The first and second word lines WL1a and WL2a may extend in the first direction D1 and the third direction D3, thereby completely surrounding a channel region CR of each of the first semiconductor patterns SP1. The first and second word lines WL and WL2a with the first semiconductor patterns SP1 may form gate-all-around (GAA) structures (i.e., GAA transistors).

The first word line WL1a may be disposed between the source region SR and the drain region DR of the first semiconductor pattern SP1 in the plan view, and the second word line WL2a may be disposed between the first word line WL1a and the drain region DR of the first semiconductor pattern SP1 in the plan view.

The third and fourth word lines WL1b and WL2b may extend in the first direction D1 and the third direction D3, thereby completely surrounding the channel regions CR of the second semiconductor patterns SP2. The third and fourth word lines WL1b and WL2b with the second semiconductor patterns SP2 may form a gate-all-around (GAA) structures (i.e., GAA transistors).

The third word line WL1b may be disposed between the source region SR and the drain region DR of the second semiconductor pattern SP2 in the plan view, and the fourth word line WL2b may be disposed between the third word line WL1b and the drain region DR of the second semiconductor pattern SP2 in the plan view.

As described above, charge storage patterns CSP may be disposed between the channel regions CR of the first semiconductor patterns SP1 and the first and second word lines WL1a and WL2a and between the channel regions CR of the second semiconductor patterns SP2 and the third and fourth word lines WL1b and WL2b, respectively. The charge storage patterns CSP may completely surround the channel regions CR of the first and second semiconductor patterns SP1 and SP2. The charge storage patterns CSP may be spaced apart from each other in the first, second and third directions D1, D2 and D3, like the first and second semiconductor patterns SP1 and SP2. Each of the charge storage patterns CSP may include a tunnel insulating layer TIL, a charge trap layer CTL, and a blocking insulating layer BIL.

The upper insulating layer 130 may be provided on the first and second word lines WL and WL2a and the third and fourth word lines WL1b and WL2b.

Figure 9:
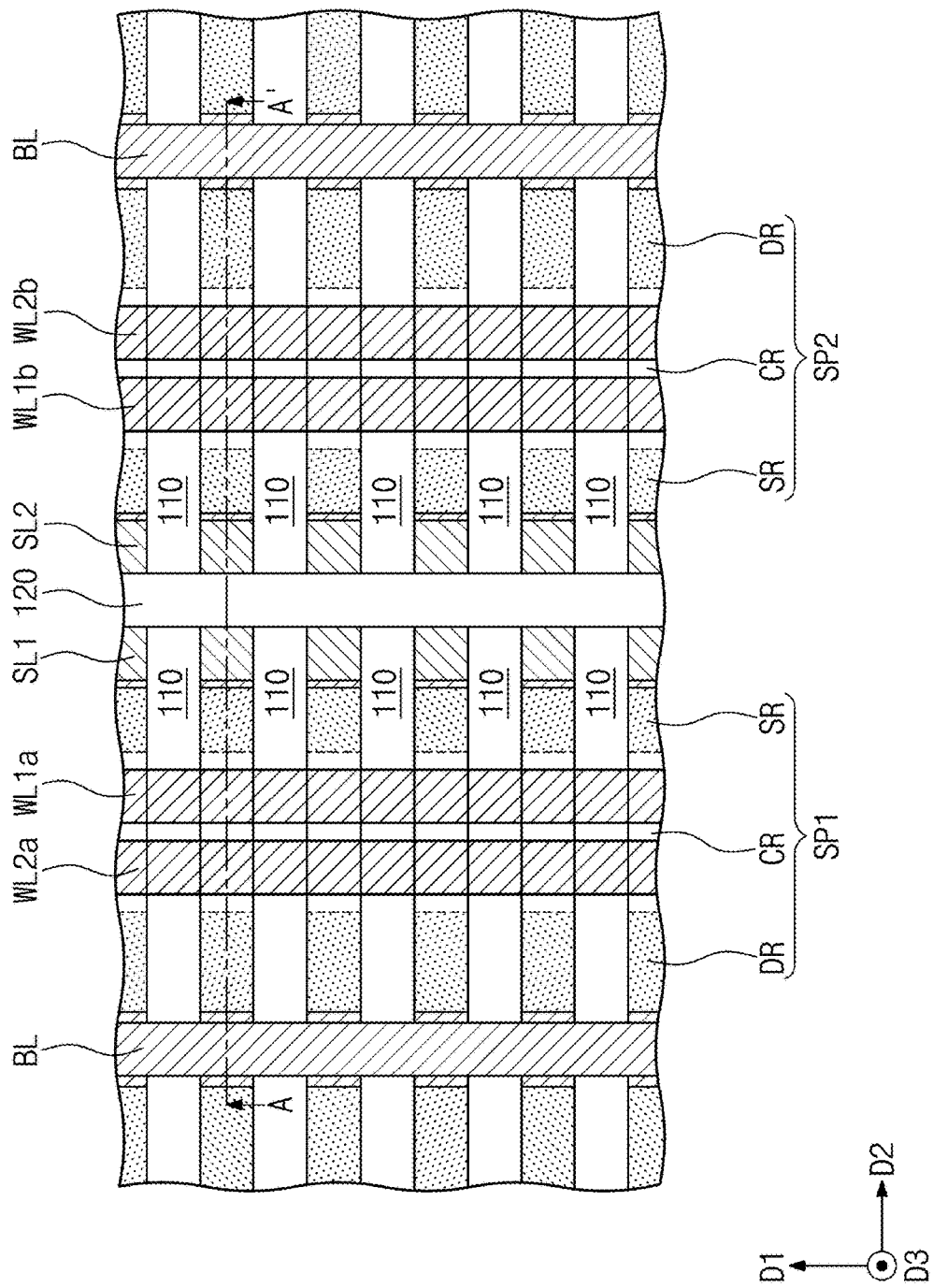
FIG. 9 is a plan view illustrating a semiconductor memory device according to some embodiments of the inventive concepts.
Figure 10:
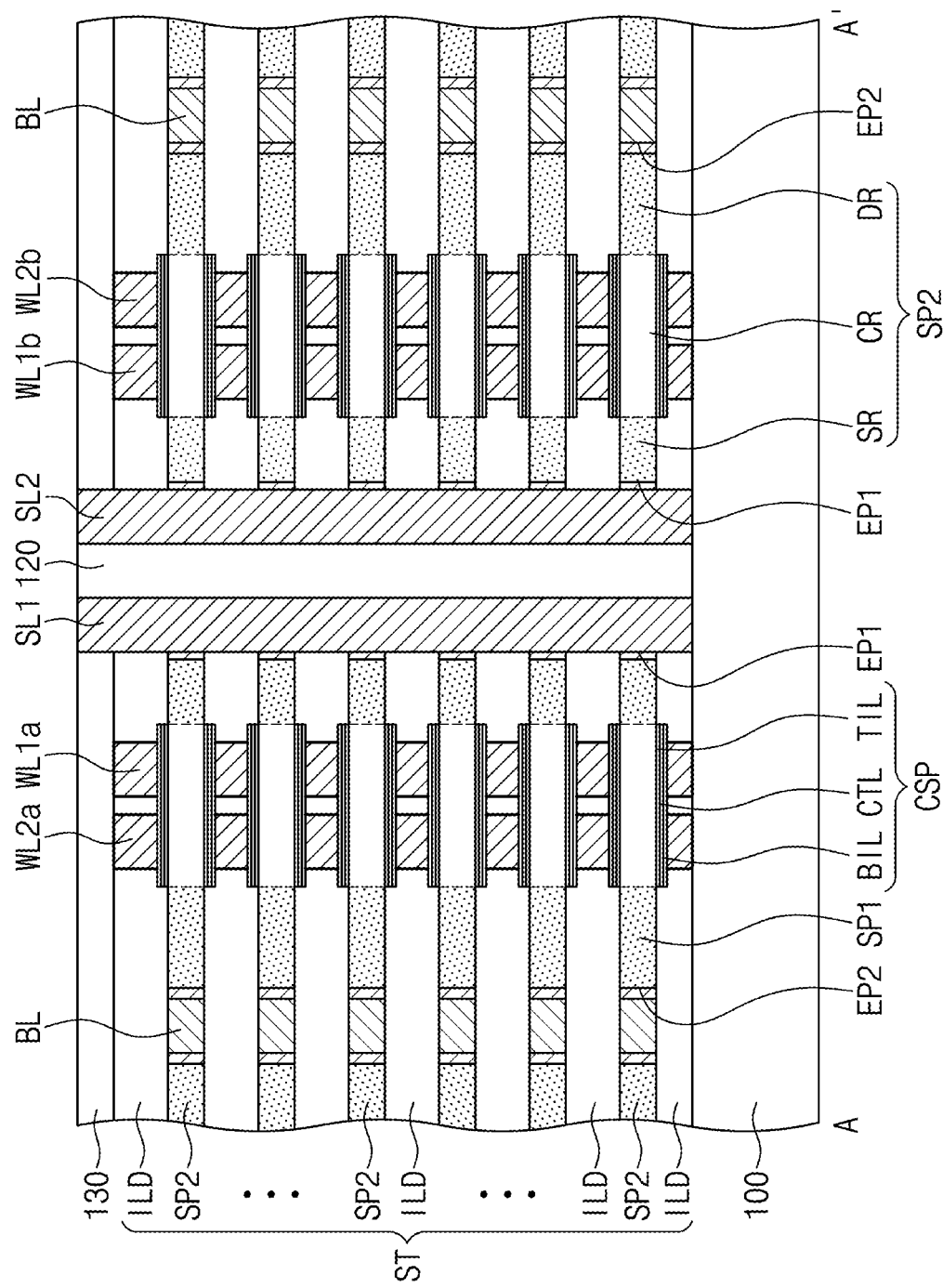
FIG. 10 is a cross-sectional view taken along line A-A' of FIG. 9 to illustrate a semiconductor memory device according to some embodiments of the inventive concepts.

FIG. 9 is a plan view illustrating a semiconductor memory device according to some embodiments of the inventive concepts. FIG. 10 is a cross-sectional view taken along line A-A' of FIG. 9 to illustrate a semiconductor memory device according to some embodiments of the inventive concepts. Hereinafter, the descriptions to the same technical features as in the above embodiments of FIGS. 5 to 8 will be omitted for the purpose of ease and convenience in explanation.

Referring to FIGS. 9 and 10, first semiconductor patterns SP1 may be provided at intersection points of first source lines SL1 and bit lines BL, respectively, and second semiconductor patterns SP2 may be provided at intersection points of second source lines SL2 and the bit lines BL, respectively. The first and second semiconductor patterns SP1 and SP2 adjacent to each other in the second direction D2 may share the bit line BL.

The first and second source lines SL1 and SL2 may be adjacent to each other in the second direction D2, and a second separation insulating pattern 120 may be provided between the first and second source lines SL1 and SL2. The first source lines SL1 may extend in the third direction D3 and may be spaced apart from each other in the first direction D1 by first separation insulating patterns 110. Likewise, the second source lines SL2 may extend in the third direction D3 and may be spaced apart from each other in the first direction D1 by the first separation insulating patterns 110.

Figure 11:
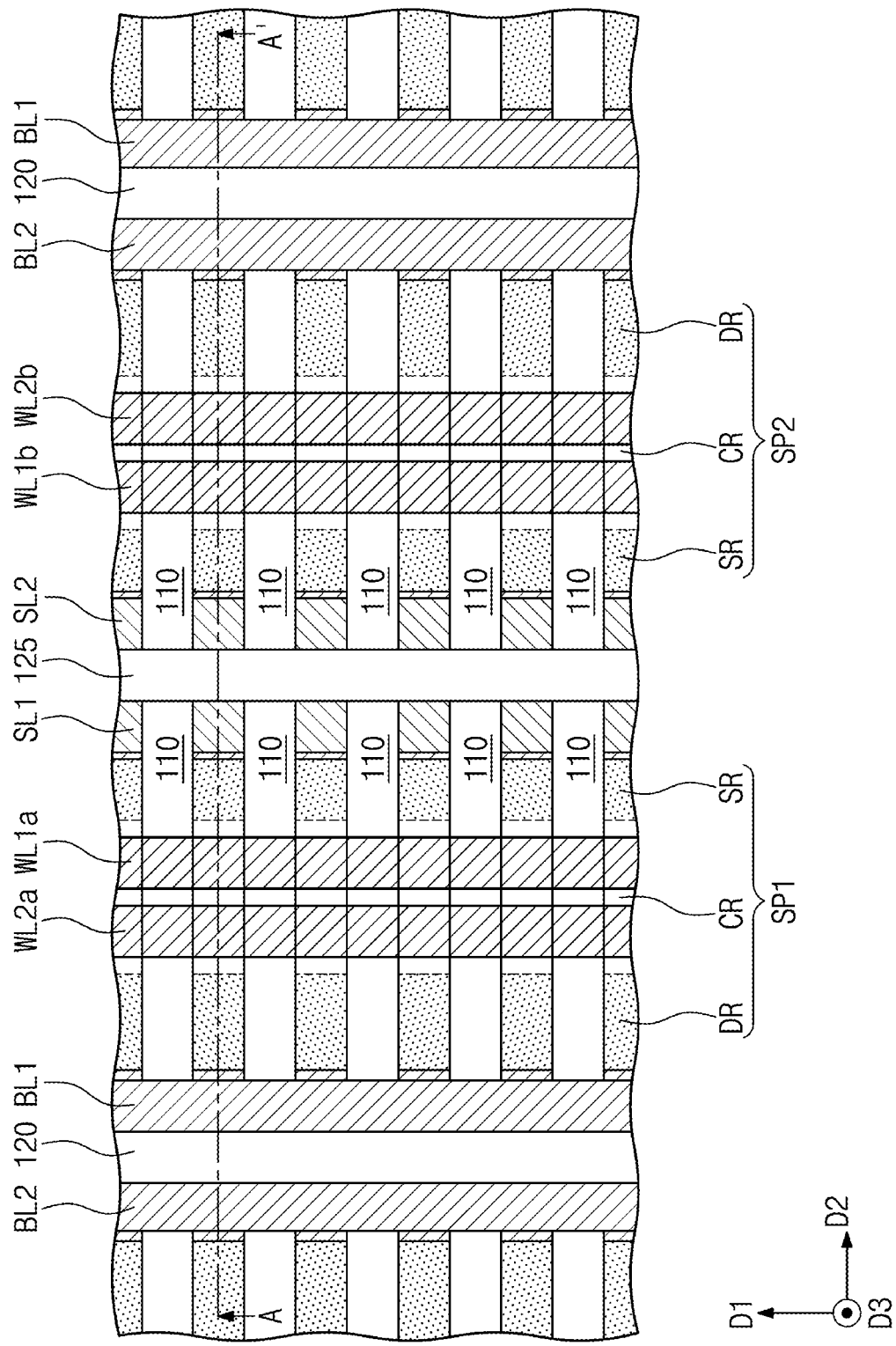
FIG. 11 is a plan view illustrating a semiconductor memory device according to some embodiments of the inventive concepts.
Figure 12:
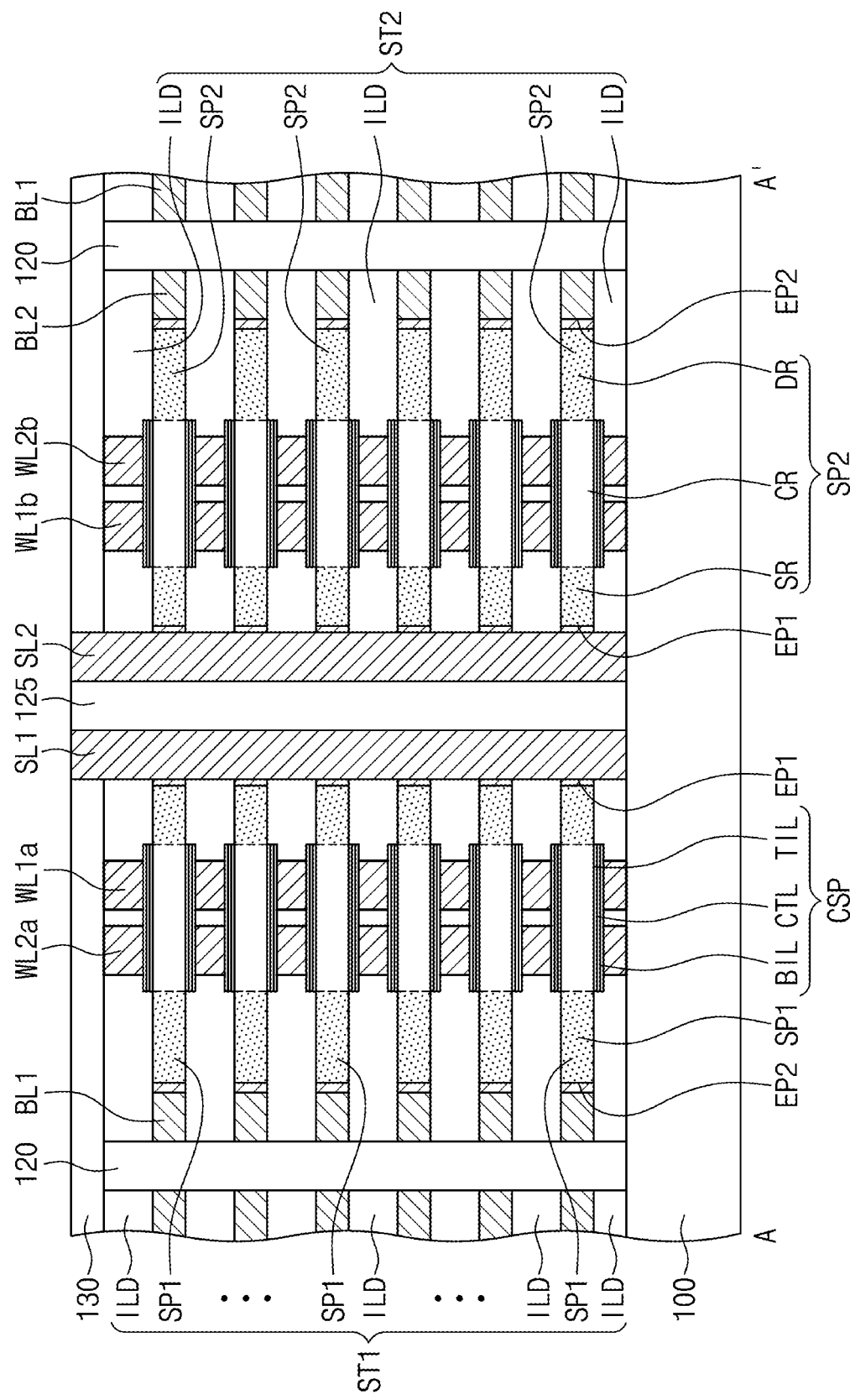
FIG. 12 is a cross-sectional view taken along line A-A' of FIG. 11 to illustrate a semiconductor memory device according to some embodiments of the inventive concepts.

FIG. 11 is a plan view illustrating a semiconductor memory device according to some embodiments of the inventive concepts. FIG. 12 is a cross-sectional view taken along line A-A' of FIG. 11 to illustrate a semiconductor memory device according to some embodiments of the inventive concepts. Hereinafter, the descriptions to the same technical features as in the above embodiments of FIGS. 5 to 8 will be omitted for the purpose of ease and convenience in explanation.

Referring to FIGS. 11 and 12, first semiconductor patterns SP1 may be provided at intersection points of first bit lines BL1 and first source lines SL1, respectively, and second semiconductor patterns SP2 may be provided at intersection points of second bit lines BL2 and second source lines SL2, respectively.

The first and second bit lines BL1 and BL2 may be adjacent to each other in the second direction D2, and a second separation insulating pattern 120 extending in the first direction D1 may be provided between the first and second bit lines BL1 and BL2.

The first and second source lines SL1 and SL2 may be adjacent to each other in the second direction D2, and a third separation insulating pattern 125 may be provided between the first and second source lines SL1 and SL2. The first source lines SL1 may extend in the third direction D3 and may be spaced apart from each other in the first direction D1 by first separation insulating patterns 110. Likewise, the second source lines SL2 may extend in the third direction D3 and may be spaced apart from each other in the first direction D1 by the first separation insulating patterns 110.

The first semiconductor patterns SP1 and the second semiconductor patterns SP2 may be mirror-symmetrical with respect to the third separation insulating pattern 125. For example, first stack structures ST1 may be spaced apart from each other in the first direction D1 between a pair of the second and third separation insulating patterns 120 and 125, and second stack structures ST2 may be spaced apart from each other in the first direction D1 between a pair of the second and third separation insulating patterns 120 and 125. Each of the first stack structures ST1 may include interlayer insulating layers ILD and the first semiconductor patterns SP1, which are alternately stacked in the third direction D3. Each of the second stack structures ST2 may include interlayer insulating layers ILD and the second semiconductor patterns SP2, which are alternately stacked in the third direction D3.

Figure 13:
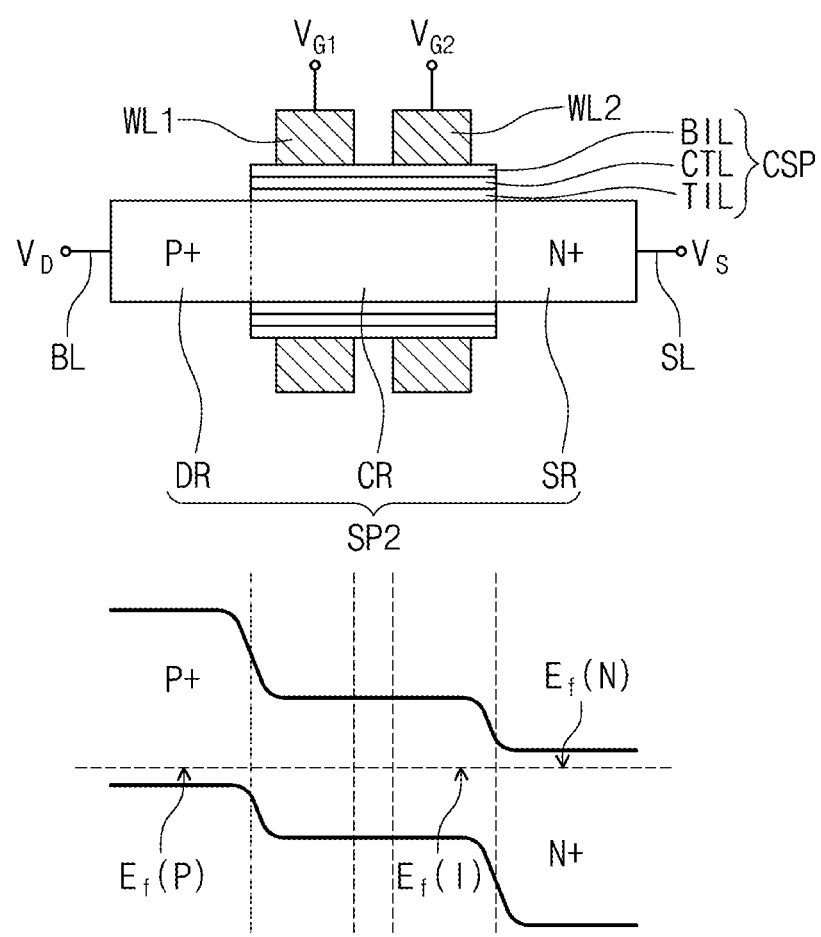
FIGS. 13, 14 and 15 are views for explaining an operation of a semiconductor memory device according to some embodiments of the inventive concepts.
Figure 14:
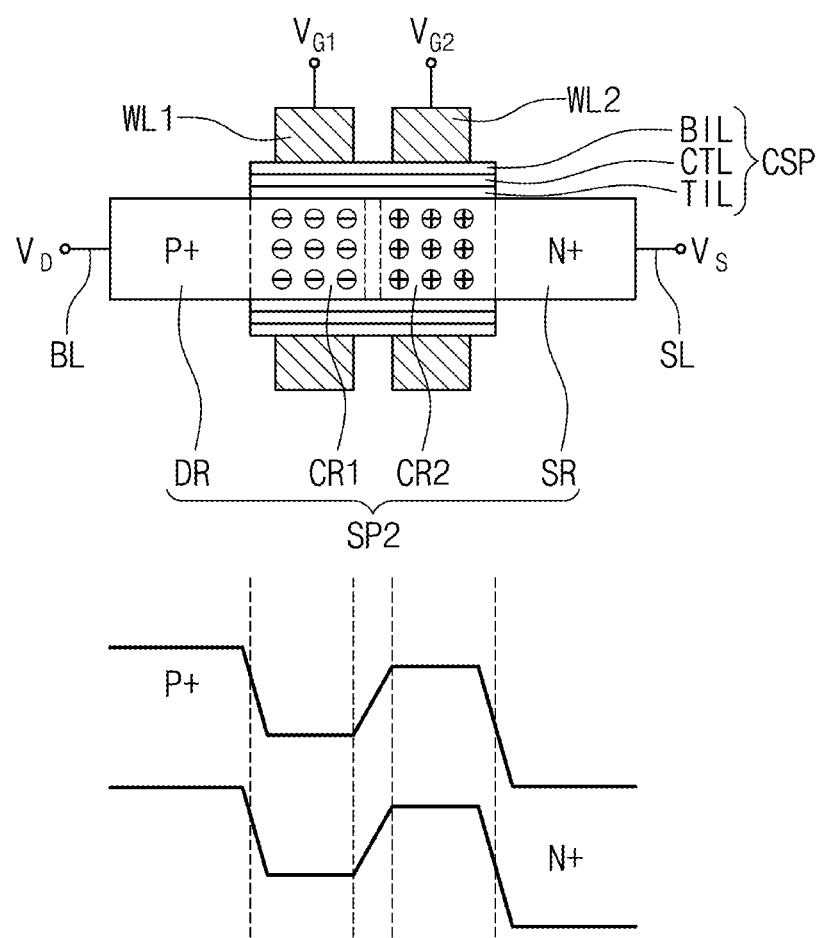
Figure 15:
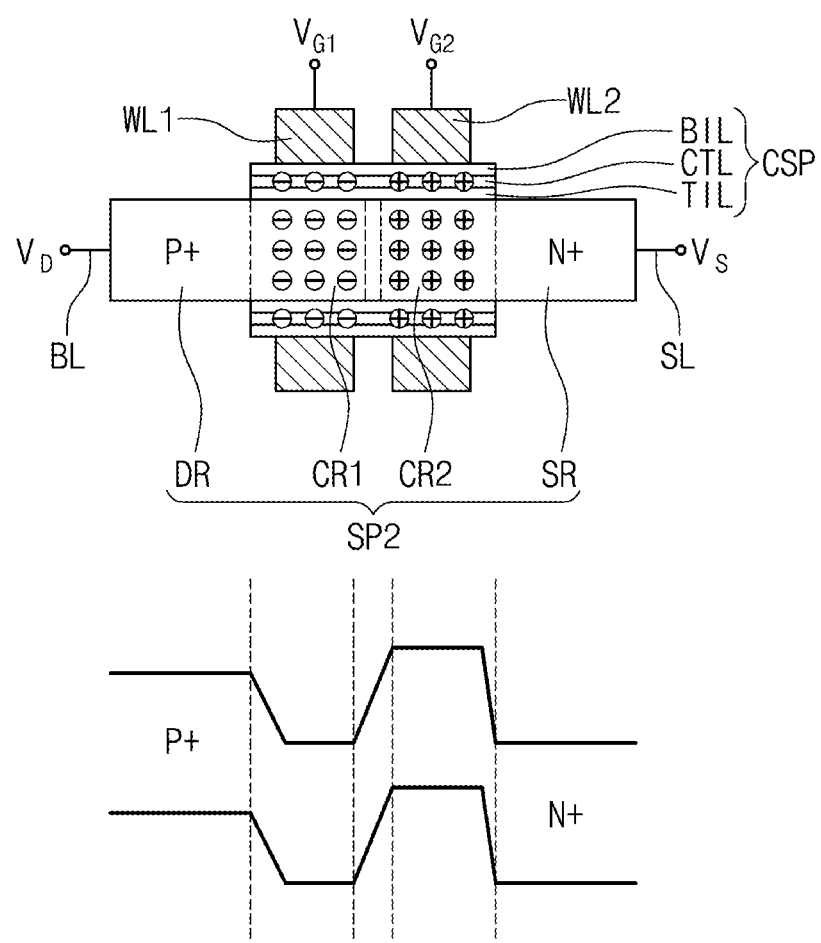
Figure 16:
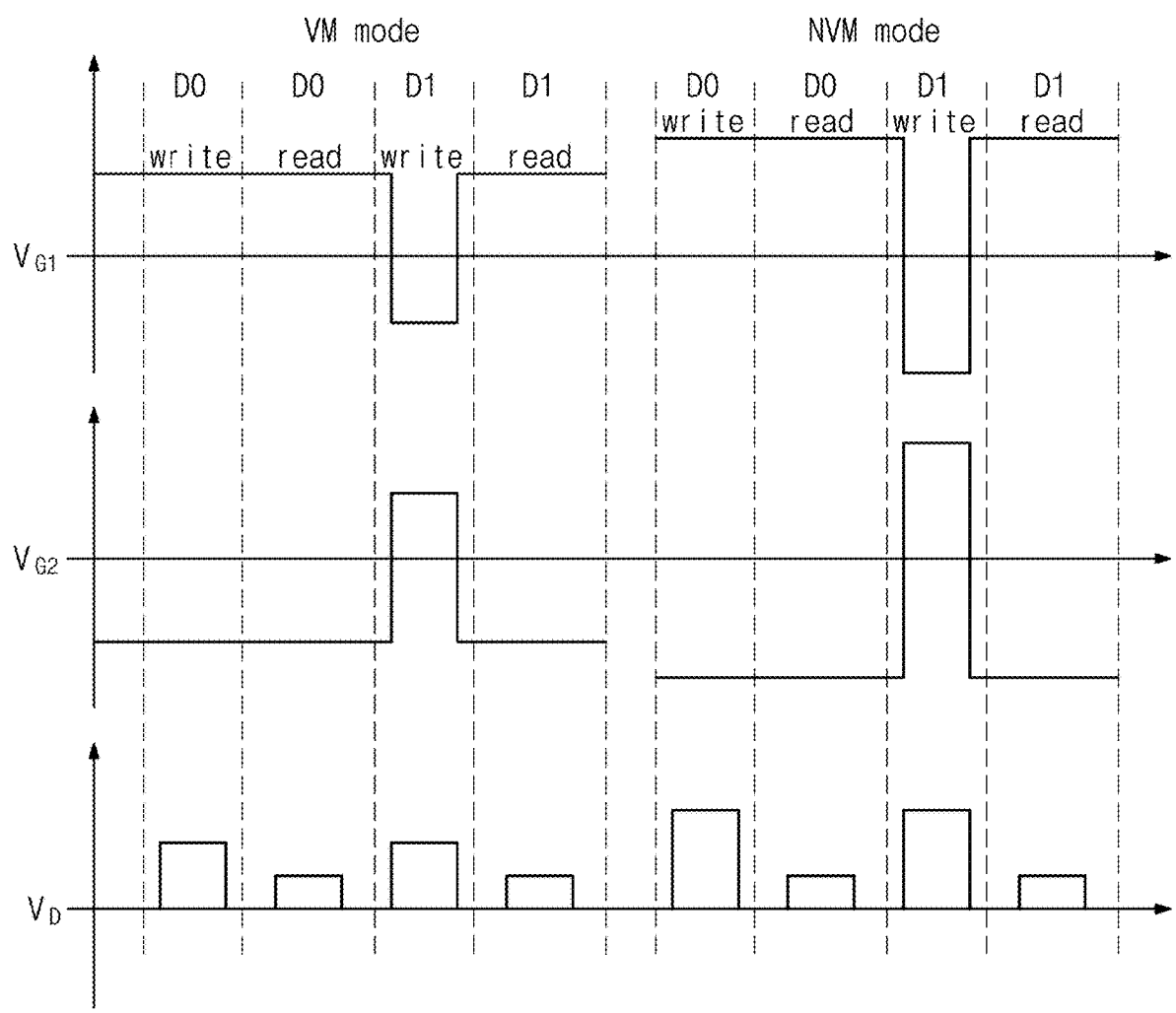
FIG. 16 is a timing diagram illustrating voltages of write and read operations of a semiconductor memory device according to some embodiments of the inventive concepts.

FIGS. 13, 14 and 15 are views for explaining an operation of a semiconductor memory device according to some embodiments of the inventive concepts. FIG. 16 is a timing diagram illustrating voltage conditions of write and read operations of a semiconductor memory device according to some embodiments of the inventive concepts.

FIG. 13 illustrates an energy level in a thermal equilibrium state of the semiconductor memory device.

Referring to FIG. 13, in a thermal equilibrium state in which a bias is not applied to the source region SR, the drain region DR and first and second gate electrodes WL1 and WL2, energy levels of a valence band and a conduction band of the drain region DR may be higher than those of the source region SR since a P-type Fermi level of the drain region DR is different from an N-type Fermi level of the source region SR. For example, an energy level of the drain region DR may be higher than an energy level of the channel region CR, and an energy level of the source region SR may be lower than the energy level of the channel region CR. For example, the P-type Fermi level $E_f(P)$ may be higher than an intrinsic Fermi level $E_f(I)$ of the channel region CR, which is an intrinsic semiconductor, and the N-type Fermi level $E_f(N)$ may be lower than the intrinsic Fermi level $E_f(I)$ of the channel region CR, and when the drain region DR, the source region SR, and the channel region CR are in the thermal equilibrium (e.g., no drain voltage is applied), the energy levels thereof may be shifted such that the P-type Fermi level $E_f(P)$, the N-type Fermi level $E_f(N)$, and the intrinsic Fermi level $E_f(I)$ have the same energy level.

FIG. 14 illustrates a write operation state in a volatile memory mode.

Referring to FIGS. 14 and 16, a first gate voltage $V_{G1}$ and a second gate voltage $V_{G2}$ which are opposite or complementary to each other may be applied to the first gate electrode WL1 and the second gate electrode WL2, respectively. For example, in the volatile memory mode, the first and second gate voltages $V_{G1}$ and $V_{G2}$ may be about 3V and about –3V, respectively.

In the volatile memory mode, the first and second gate voltages $V_{G1}$ and $V_{G2}$ opposite or complementary to each other may be applied to change an energy level of a first channel region CR1 adjacent to the first gate electrode WL1 and an energy level of a second channel region CR2 adjacent to the second gate electrode WL2.

When the first gate voltage $V_{G1}$ is greater than the second gate voltage $V_{G2}$, the energy level of the first channel region CR1 may be changed by the first gate voltage $V_{G1}$ as if the first channel region CR1 is doped with dopants having the first conductivity type (e.g., an N-type), and the energy level of the second channel region CR2 may be changed by the second gate voltage $V_{G2}$ as if the second channel region CR2 is doped with dopants having the second conductivity type (e.g., a P-type). Thus, an energy barrier may be formed in the channel region in the intrinsic state. For example, a p-i-n structure of the semiconductor pattern SP2 may be changed into a p-n-p-n structure, and electrons may be stored in the first channel region CR1, and holes may be stored in the second channel region CR2. When a drain voltage $V_D$ (e.g., about 1 V) is applied to the bit line BL in the state in which the channel region has the energy level of the p-n-p-n structure, an energy barrier between the drain region DR and the first channel region CR1 may be increased, and thus a drain current through the semiconductor pattern SP2 does not flow, which corresponds to writing zero (0) state.

To read the data 0 state, the first and second gate voltages $V_{G1}$ and $V_{G2}$ opposite or complementary to each other may be applied to the first and second gate electrodes WL1 and WL2, and the drain voltage $V_D$ for a read operation, which may be lower than the drain voltage $V_D$ for the write operation of the data zero state, may be applied to the bit line BL. The drain current does not flow due to an energy barrier between the first and second channel regions CR1 and CR2, and thus no drain current may be determined as the data 0 state.

Figure 18:
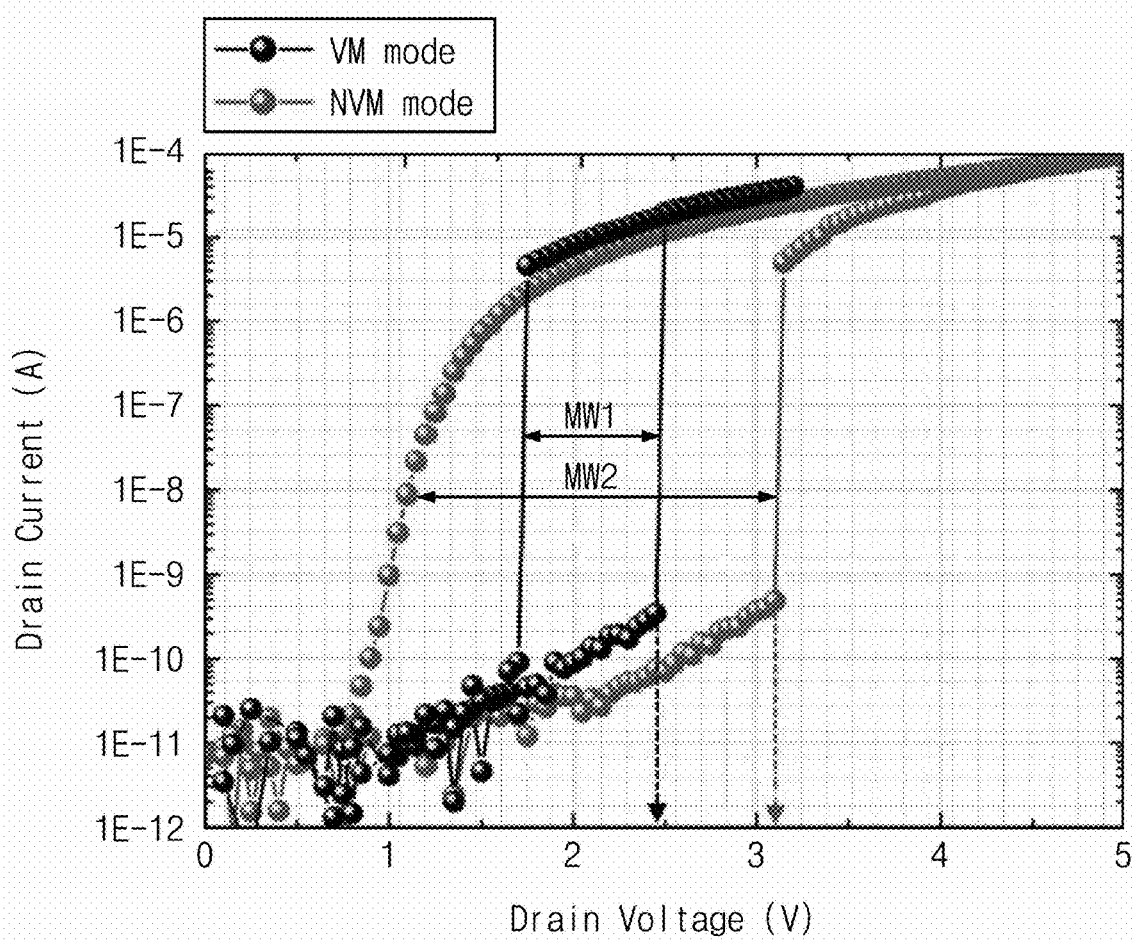
FIG. 18 is a graph showing a drain current according to a drain voltage of a semiconductor memory device according to some embodiments of the inventive concepts.

When the first gate voltage $V_{G1}$ (e.g., –3 V) is less than the second gate voltage $V_{G2}$ (e.g., +3 V), the drain voltage $V_D$ (e.g., about 1 V) may be applied to the bit line BL in a state in which the first and second gate voltages $V_{G1}$ and $V_{G2}$ are applied, and thus the energy barrier between the drain region DR and the first channel region CR1 may be reduced and the energy barrier between the source region SR and the second channel region CR2 may be reduced. As a result, the drain current may flow through the semiconductor pattern SP2, and the flow of the drain current may correspond to writing one (1) state. For examples, charges may be injected into the first and second channel regions CR1 and CR2, and thus the energy barriers between the source and drain regions SR and DR may disappear and at the same time, the semiconductor pattern SP2 may operate like a diode in an internal forward bias state. This phenomenon may generate a memory window characteristic MW1 in the volatile memory mode, as illustrated in FIG. 18 (data 1 state).

To read the data 1 state, the first and second gate voltages $V_{G1}$ (e.g., +3 V) and $V_{G2}$ (e.g., –3 V) opposite or complementary to each other may be applied to the first and second gate electrodes WL1 and WL2, and a read voltage may be applied to the bit line BL. The energy barriers between the first and second channel regions CR1 and CR2 may be reduced, and thus the drain current may flow. As a result, the data 1 state may be determined.

FIG. 15 illustrates a write operation state in a non-volatile memory mode.

Referring to FIGS. 15 and 16, first and second gate voltages $V_{G1}$ and $V_{G2}$ in the non-volatile memory mode may be greater than the first and second gate voltages $V_{G1}$ and $V_{G2}$ in the volatile memory mode. For example, in the non-volatile memory mode, the first and second gate voltages $V_{G1}$ and $V_{G2}$ may be about 11 V and about –11 V. In the non-volatile memory mode, the first and second gate voltages $V_{G1}$ and $V_{G2}$ opposite or complementary to each other may be applied to change an energy level of the first channel region CR1 adjacent to the first gate electrode WL1 and an energy level of the second channel region CR2 adjacent to the second gate electrode WL2.

When the first gate voltage $V_{G1}$ is greater than the second gate voltage $V_{G2}$, the energy level of the first channel region CR1 may be changed by the first gate voltage $V_{G1}$ as if the first channel region CR1 is doped with dopants having the first conductivity type (e.g., an N-type), and the energy level of the second channel region CR2 may be changed by the second gate voltage $V_{G2}$ as if the second channel region CR2 is doped with dopants having the second conductivity type (e.g., a P-type). Thus, an energy barrier may be formed in the channel region in the intrinsic state. For example, the p-i-n structure of the semiconductor pattern SP2 may be changed into a p-n-p-n structure.

When the drain voltage $V_D$ (e.g., about 2 V) is applied to the bit line BL in the state in which the semiconductor pattern SP2 has the energy level of the p-n-p-n structure, the energy barrier between the drain region DR and the first channel region CR1 may be increased, and thus the drain current through the semiconductor pattern SP2 does not flow, which corresponds to writing 0 state.

Since absolute values of the first and second gate voltages $V_{G1}$ and $V_{G2}$ in the non-volatile memory mode are greater than those in the volatile memory mode, charges may be accumulated in the first and second channel regions CR1 and CR2 of the semiconductor pattern SP2, and charges may be trapped in the charge trap layer CTL by a hot carrier injection phenomenon or charges stored in the charge trap layer CTL may be discharged into the first and second channel regions CR1 and CR2.

For example, a ground voltage may be applied to the source region SR, the first and second gate voltages $V_{G1}$ and $V_{G2}$ opposite or complementary to each other may be applied to the first and second gate electrodes WL1 and WL2, and a predetermined drain voltage $V_D$ may be applied to the bit line BL. For example, the first and second gate voltages $V_{G1}$ and $V_{G2}$ may be 11V and –11V, and the drain voltage $V_D$ may be about 2V. Electrons may be trapped in the charge trap layer CTL adjacent to the first channel region CR1, and holes may be trapped in the charge trap layer CTL adjacent to the second channel region CR2. This phenomenon may generate a memory window characteristic MW2 in the non-volatile memory mode, as illustrated in FIG. 18.

Figure 17:
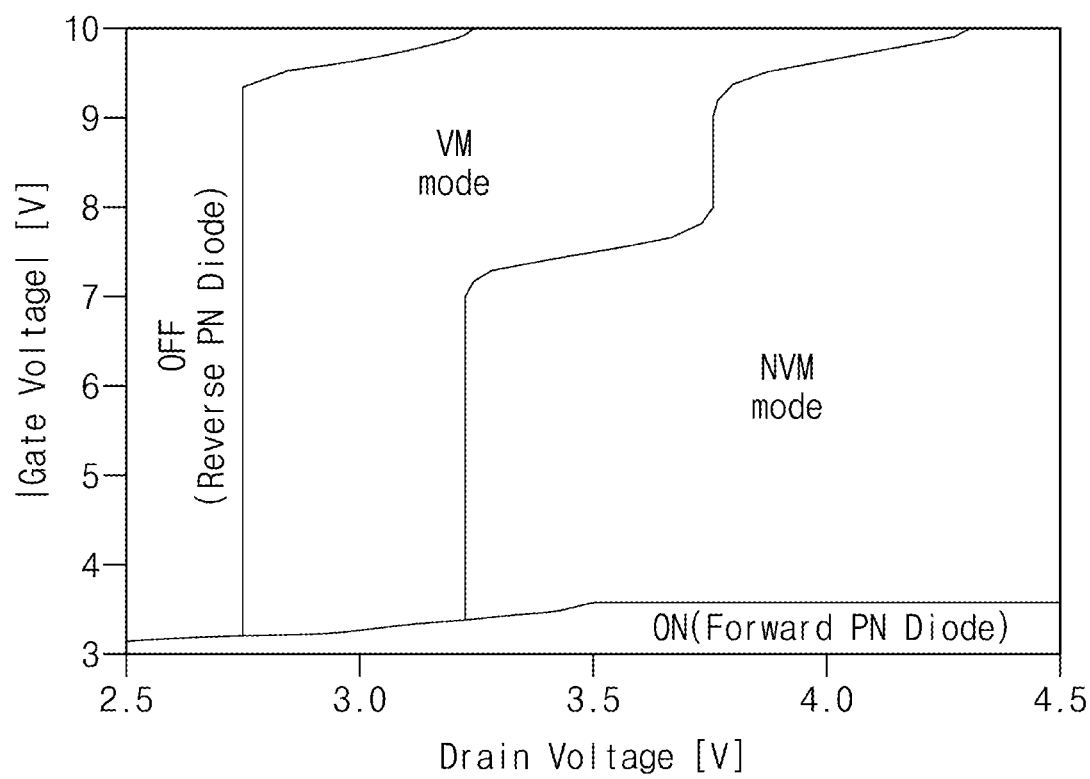
FIG. 17 is a graph showing operation characteristics according to drain voltage and gate voltage conditions of a semiconductor memory device according to some embodiments of the inventive concepts.

FIG. 17 is a graph showing operation characteristics according to drain voltage and gate voltage conditions of a semiconductor memory device according to some embodiments of the inventive concepts. FIG. 18 is a graph showing a drain current according to a drain voltage of a semiconductor memory device according to some embodiments of the inventive concepts.

Referring to FIGS. 17 and 18, a drain current according to a drain voltage may show hysteresis and may have a volatile memory characteristic or a non-volatile memory characteristic, depending on a drain voltage condition.

The memory cell in the volatile memory mode has a first memory window MW1 which corresponds to a width of the hysteresis of the drain current according to the drain voltage, and the memory cell in the non-volatile memory has a second memory window MW2 which corresponds to a width of the hysteresis of the drain current according to the drain voltage.

According to the embodiments of the inventive concepts, the memory cells without a separate data storage element may be three-dimensionally implemented on the substrate. Each of the memory cells may selectively operate in the volatile or non-volatile memory mode, depending on a voltage condition.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor memory device comprising:
a plurality of first conductive lines stacked in a first direction perpendicular to a top surface of a substrate and extending lengthwise in a second direction parallel to the top surface of the substrate;
a plurality of second conductive lines extending lengthwise in the first direction and spaced apart from the plurality of first conductive lines in a third direction parallel to the top surface of the substrate and different from the second direction; and
a plurality of memory cells, each being provided at a corresponding one of a plurality of intersection points between the plurality of first conductive lines and the plurality of second conductive lines,
wherein each of the plurality of memory cells comprises a semiconductor pattern extending parallel to the top surface of the substrate, the semiconductor pattern including a source region having a first conductivity type, a drain region having a second conductivity type different from the first conductivity type, and a channel region between the source region and the drain region;
first and second gate electrodes surrounding the channel region of the semiconductor pattern; and
a charge storage pattern between the semiconductor pattern and each of the first and second gate electrodes,
wherein the first gate electrode is between the source region and the drain region and the second gate electrode is between the first gate electrode and the drain region, in each of the plurality of memory cells.

2. The semiconductor memory device of claim 1,
wherein each of the first and second gate electrodes extends lengthwise in the first direction, and
wherein the first and second gate electrodes are spaced apart from each other in the third direction.

3. The semiconductor memory device of claim 1,
wherein the charge storage pattern comprises:
a charge trap layer between the semiconductor pattern and each of the first and second gate electrodes;
a blocking insulating layer between the charge trap layer and each of the first and second gate electrodes; and
a tunnel insulating layer between the charge trap layer and the semiconductor pattern.

4. The semiconductor memory device of claim 1,
wherein the semiconductor pattern extends lengthwise in the third direction,
wherein the first and second gate electrodes surround each of a plurality of semiconductor patterns of the plurality of memory cells, and
wherein the plurality of memory cells are adjacent to each other in the first direction and in the second direction.

5. The semiconductor memory device of claim 1, further comprising:
a plurality of first electrodes, each being disposed between a corresponding one of a plurality of semiconductor patterns of the plurality of memory cells and a corresponding one of the plurality of first conductive lines; and
a plurality of second electrodes, each being disposed between a corresponding one of the plurality of semiconductor patterns and a corresponding one of the plurality of second conductive lines.

6. The semiconductor memory device of claim 1,
wherein the semiconductor pattern extends lengthwise in the third direction, and
wherein a length of the source region in the third direction is different from a length of the drain region in the third direction.

7. The semiconductor memory device of claim 1,
wherein the channel region of the semiconductor pattern is an intrinsic semiconductor.

8. The semiconductor memory device of claim 1, further comprising:
a plurality of interlayer insulating layers, each being provided between a corresponding pair of two first conductive lines, adjacent to each other in the first direction, among the plurality of first conductive lines and between a corresponding pair of two semiconductor patterns of the memory cells, adjacent to each other in the first direction, among the plurality of semiconductor patterns.

9. A semiconductor memory device comprising:
a plurality of semiconductor patterns stacked in a first direction perpendicular to a top surface of a substrate, wherein each of the plurality of semiconductor patterns includes a source region having a first conductivity type, a drain region having a second conductivity type different from the first conductivity type, and a channel region between the source region and the drain region;
a pair of first and second word lines surrounding a channel region of each of the plurality of semiconductor patterns and extending lengthwise in the first direction;
a plurality of charge storage patterns, each surrounding a channel region of a corresponding semiconductor pattern of the plurality of semiconductor patterns, and being disposed between the corresponding semiconductor pattern and each of the pair of the first and second word lines;

a plurality of first conductive lines stacked in the first direction, each being connected to a drain region of a corresponding one of the plurality of semiconductor patterns; and a second conductive line extending lengthwise in the first direction and connected in common to a plurality of source regions of the plurality of semiconductor patterns, wherein the pair of first and second word lines are disposed between the source region and the drain region of each of the plurality of semiconductor patterns.

10. The semiconductor memory device of claim 9, wherein the plurality of first conductive lines extend lengthwise in a second direction parallel to the top surface of the substrate, and wherein each of the plurality of semiconductor patterns has a long axis in a third direction which is parallel to the top surface of the substrate and intersects the second direction.

11. The semiconductor memory device of claim 9, wherein each of the plurality of charge storage patterns comprises:

a charge trap layer between a corresponding semiconductor pattern of the plurality of semiconductor patterns and each of the pair of first and second word lines;

a blocking insulating layer between the charge trap layer and the pair of the first and second word lines; and a tunnel insulating layer between the charge trap layer and the corresponding semiconductor pattern.

12. The semiconductor memory device of claim 9, wherein the channel region of each of the plurality of semiconductor patterns is an intrinsic semiconductor.

13. The semiconductor memory device of claim 9, further comprising:

a plurality of first electrodes, each being disposed between a corresponding one of the plurality of first conductive lines and a drain region of a corresponding one of the plurality of semiconductor patterns; and a plurality of second electrodes, each being disposed between the second conductive line and a source region of a corresponding one of the plurality of semiconductor patterns.

14. The semiconductor memory device of claim 9, further comprising:

a plurality of interlayer insulating layers, each being provided between a corresponding pair of two semiconductor patterns, adjacent to each other in the first direction, among the plurality of semiconductor patterns and between a corresponding pair of the first conductive lines, adjacent to each other in the first direction, among the plurality of first conductive lines.

15. A semiconductor memory device comprising:

a plurality of first bit lines extending lengthwise in a first direction parallel to a top surface of a substrate and stacked in a second direction perpendicular to the top surface of the substrate;

a plurality of second bit lines extending lengthwise in the first direction and stacked in the second direction, the plurality of second bit lines spaced apart from the plurality of first bit lines in a third direction parallel to the top surface of the substrate and intersecting the first and second directions;

a plurality of source lines extending lengthwise in the second direction between the plurality of first bit lines and the plurality of second bit lines and spaced apart from each other in the first direction;

a plurality of first memory cells, each being provided at a corresponding one of a plurality of intersection points of the plurality of first bit lines and the plurality of source lines, wherein each of the plurality of first memory cells comprises a first semiconductor pattern including a first source region having a first conductivity type, a first drain region having a second conductivity type different from the first conductivity type, and a first channel region between the first source region and the first drain region;

a plurality of second memory cells, each being provided at a corresponding one of a plurality of intersection points of the plurality of second bit lines and the plurality of source lines, wherein each of the plurality of second memory cells comprises a second semiconductor pattern including a second source region having the first conductivity type, a second drain region having the second conductivity type, and a second channel region between the second source region and the second drain region;

a pair of first and second word lines surrounding each of a plurality of first channel regions of a plurality of first semiconductor patterns of the plurality of first memory cells and extending in the first direction and the second direction;

a plurality of first charge storage patterns, each surrounding a first channel region of a corresponding first semiconductor pattern of the plurality of first semiconductor patterns, and being disposed between the corresponding first semiconductor pattern and each of the pair of the first and second word lines;

a pair of third and fourth word lines surrounding each of a plurality of second channel regions of a plurality of second semiconductor patterns of the plurality of second memory cells and extending in the first direction and the second direction; and a plurality of second charge storage patterns, each surrounding a second channel region of a corresponding second semiconductor pattern of the plurality of second semiconductor patterns, and being disposed between the corresponding second semiconductor pattern and each of the pair of the third and fourth word lines.

16. The semiconductor memory device of claim 15, further comprising:

a plurality of first separation insulating patterns, each being provided between a corresponding pair of two first memory cells, adjacent to each other in the first direction, among the plurality of first memory cells and between a corresponding pair of two second memory cells, adjacent to each other in the first direction, among the plurality of second memory cells, wherein each of the plurality of first separation insulating patterns extends in the second direction and the third direction.

17. The semiconductor memory device of claim 15, wherein each of the plurality of first charge storage patterns comprises:

a first charge trap layer between a corresponding first semiconductor pattern of the plurality of first semiconductor patterns and each of the pair of the first and second word lines;

a first blocking insulating layer between the first charge trap layer and each of the pair of the first and second word lines; and a first tunnel insulating layer between the first charge trap layer and the corresponding first semiconductor pattern, wherein each of the plurality of second charge storage patterns comprises:

a second charge trap layer between a corresponding second semiconductor pattern of the plurality of second semiconductor patterns and each of the pair of the third and fourth word lines;

a second blocking insulating layer between the second charge trap layer and each of the pair of the third and fourth word lines; and a second tunnel insulating layer between the second charge trap layer and the corresponding second semiconductor pattern.

18. The semiconductor memory device of claim 15, further comprising:

a plurality of interlayer insulating layers, each being provided between a corresponding pair of two first semiconductor patterns, adjacent to each other in the second direction, among the plurality of first semiconductor patterns and between a pair of second semiconductor patterns, adjacent to each other in the second direction, among the plurality of second semiconductor patterns, wherein each of the plurality of first bit lines is disposed between a pair of two interlayer insulating layers, adjacent to each other in the second direction, among the plurality of interlayer insulating layers, and wherein each of the plurality of second bit lines is disposed between a pair of two interlayer insulating layers, adjacent to each other in the second direction, among the plurality of interlayer insulating layers.

19. The semiconductor memory device of claim 15, further comprising:

a pair of second separation insulating patterns extending in the first direction and the second direction on the substrate, wherein the plurality of first bit lines and the plurality of second bit lines are disposed between the pair of second separation insulating patterns.

20. The semiconductor memory device of claim 15, wherein each of the plurality of first and second semiconductor patterns is parallel to the top surface of the substrate and has a long axis in the third direction.

* * * * *